(12) United States Patent
Kumbhat et al.

(10) Patent No.: US 10,134,682 B2
(45) Date of Patent: Nov. 20, 2018

(54) CIRCUIT PACKAGE WITH SEGMENTED EXTERNAL SHIELD TO PROVIDE INTERNAL SHIELDING BETWEEN ELECTRONIC COMPONENTS

(71) Applicant: Avago Technologies General IP (Singapore) Pte. Ltd., Singapore (SG)

(72) Inventors: Nitesh Kumbhat, San Jose, CA (US); Deog Soon Choi, Seol (KR); Ashish Alawani, San Jose, CA (US); Li Sun, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 35 days.

(21) Appl. No.: 14/920,812

(22) Filed: Oct. 22, 2015

(65) Prior Publication Data

US 2017/0117230 A1    Apr. 27, 2017

(51) Int. Cl.
*H01L 23/552* (2006.01)
*H01L 23/498* (2006.01)
(Continued)

(52) U.S. Cl.
CPC ........ *H01L 23/552* (2013.01); *H01L 21/4889* (2013.01); *H01L 21/4896* (2013.01);
(Continued)

(58) Field of Classification Search
CPC ............. H01L 21/4889; H01L 21/4896; H01L 21/561; H01L 21/565; H01L 2224/13082;
(Continued)

(56) References Cited

U.S. PATENT DOCUMENTS 5,838,551 A * 11/1998 Chan ..................... H01L 23/552
                                                174/372
6,350,951 B1   2/2002 Askew
(Continued)

OTHER PUBLICATIONS

"Noise Suppression Products/EMI Suppression Filters", Reasons for requiring EMI suppression filters (EMIFIL?) | Murata Manufacturing Co., Ltd., http://www.murata.com/enus/products/emc/emifil/knowhow/basic/chapter01p1, pp. 1-29.
(Continued)

*Primary Examiner* — Michael Lebentritt
*Assistant Examiner* — Jordan Klein

(57) ABSTRACT

A module includes a circuit package having multiple electronic components on a substrate, a molded compound disposed over the substrate and the electronic components, and an external shield disposed on at least one outer surface of the circuit package. The external shield is segmented into multiple external shield partitions that are grounded, respectively. Adjacent external shield partitions of the multiple external shield partitions are separated by a corresponding gap located between adjacent electronic components of the multiple electronic components. The external shield is configured to protect the circuit package from external electromagnetic radiation and environmental stress. Each corresponding gap separating the adjacent external shield partitions is configured to provide internal shielding of at least one of the electronic components, between which the corresponding gap is located, from internal electromagnetic radiation generated by the other of the adjacent electronic components.

15 Claims, 12 Drawing Sheets

(51) Int. Cl.
*H01L 21/56* (2006.01)
*H01L 21/48* (2006.01)
*H01L 23/31* (2006.01)
*H01L 25/16* (2006.01)
*H01L 23/00* (2006.01)
*H01L 25/065* (2006.01)
*H03H 9/05* (2006.01)

(52) U.S. Cl.
CPC .......... *H01L 21/561* (2013.01); *H01L 21/565* (2013.01); *H01L 23/3121* (2013.01); *H01L 23/49811* (2013.01); *H01L 24/97* (2013.01); *H01L 25/16* (2013.01); *H01L 24/13* (2013.01); *H01L 24/16* (2013.01); *H01L 24/17* (2013.01); *H01L 24/45* (2013.01); *H01L 24/48* (2013.01); *H01L 25/0655* (2013.01); *H01L 2224/131* (2013.01); *H01L 2224/13082* (2013.01); *H01L 2224/13147* (2013.01); *H01L 2224/16225* (2013.01); *H01L 2224/16227* (2013.01); *H01L 2224/17519* (2013.01); *H01L 2224/45124* (2013.01); *H01L 2224/45139* (2013.01); *H01L 2224/45144* (2013.01); *H01L 2224/45147* (2013.01); *H01L 2224/45464* (2013.01); *H01L 2224/48227* (2013.01); *H01L 2224/97* (2013.01); *H01L 2924/14* (2013.01); *H01L 2924/157* (2013.01); *H01L 2924/1579* (2013.01); *H01L 2924/15313* (2013.01); *H01L 2924/15787* (2013.01); *H01L 2924/15788* (2013.01); *H01L 2924/181* (2013.01); *H01L 2924/1815* (2013.01); *H01L 2924/19041* (2013.01); *H01L 2924/19105* (2013.01); *H01L 2924/19107* (2013.01); *H01L 2924/3025* (2013.01); *H03H 9/0542* (2013.01); *H03H 9/0576* (2013.01)

(58) Field of Classification Search
CPC ..... H01L 2224/131; H01L 2224/13147; H01L 2224/16225; H01L 2224/16227; H01L 2224/17519; H01L 2224/45124; H01L 2224/45139; H01L 2224/45144; H01L 2224/45147; H01L 2224/45464; H01L 2224/48227; H01L 2224/97; H01L 23/3121; H01L 23/49811; H01L 23/552; H01L 24/13; H01L 24/16; H01L 24/17; H01L 24/45; H01L 24/48; H01L 24/97; H01L 25/0655; H01L 25/16; H01L 2924/181; H01L 2924/00012; H01L 2924/14; H01L 2924/15313; H01L 2924/157; H01L 2924/15787; H01L 2924/15788; H01L 2924/1579; H01L 2924/1815; H01L 2924/19041; H01L 2924/19105; H01L 2924/19107; H01L 2924/3025; H03H 9/0576
See application file for complete search history.

(56) References Cited

U.S. PATENT DOCUMENTS

| | | | | |
|---|---|---|---|---|
| 6,552,261 B2* | 4/2003 | Shlahtichman | ...... | H05K 9/0032 174/363 |
| 6,614,102 B1* | 9/2003 | Hoffman | ...... | H01L 23/552 257/659 |
| 7,898,066 B1* | 3/2011 | Scanlan | ...... | H01L 23/552 257/422 |
| 8,012,868 B1 | 9/2011 | Naval et al. | | |
| 8,071,431 B2 | 12/2011 | Hoang et al. | | |
| 8,199,518 B1* | 6/2012 | Chun | ...... | H01L 23/49811 361/767 |
| 8,748,287 B2 | 6/2014 | Barth et al. | | |
| 8,897,019 B1 | 11/2014 | Shimamura et al. | | |
| 8,948,712 B2 | 2/2015 | Chen et al. | | |
| 9,025,301 B1 | 5/2015 | Adlam | | |
| 9,041,168 B2 | 5/2015 | Hoang et al. | | |
| 9,202,747 B2* | 12/2015 | Chen | ...... | H01L 21/56 |
| 9,295,157 B2 | 3/2016 | Chen et al. | | |
| 9,508,658 B1 | 11/2016 | Convert et al. | | |
| 2003/0153123 A1* | 8/2003 | Tsai | ...... | H01L 24/97 438/107 |
| 2003/0218257 A1* | 11/2003 | Ishio | ...... | H01L 23/3114 257/781 |
| 2004/0029312 A1 | 2/2004 | Knapp et al. | | |
| 2005/0067676 A1* | 3/2005 | Mahadevan | ...... | H01L 21/561 257/659 |
| 2007/0176281 A1* | 8/2007 | Kim | ...... | H01L 23/3128 257/700 |
| 2008/0014678 A1* | 1/2008 | Howard | ...... | H01L 21/565 438/106 |
| 2009/0000114 A1 | 1/2009 | Rao et al. | | |
| 2009/0067149 A1* | 3/2009 | Bogursky | ...... | H01L 23/552 361/816 |
| 2009/0152688 A1* | 6/2009 | Do | ...... | H01L 23/552 257/659 |
| 2009/0184403 A1* | 7/2009 | Wang | ...... | H01L 21/561 257/659 |
| 2010/0285636 A1* | 11/2010 | Chen | ...... | H01L 21/561 438/113 |
| 2011/0084378 A1* | 4/2011 | Welch | ...... | H01L 21/56 257/692 |
| 2011/0140262 A1 | 6/2011 | Lee et al. | | |
| 2011/0175179 A1 | 7/2011 | Chiu et al. | | |
| 2012/0025356 A1* | 2/2012 | Liao | ...... | H01L 23/3121 257/659 |
| 2012/0061816 A1 | 3/2012 | Song et al. | | |
| 2012/0086108 A1* | 4/2012 | Wu | ...... | H01L 23/49805 257/659 |
| 2012/0146178 A1 | 6/2012 | Hoang et al. | | |
| 2012/0235259 A1 | 9/2012 | Fang et al. | | |
| 2012/0320558 A1* | 12/2012 | Foster | ...... | H05K 1/0218 361/818 |
| 2013/0082364 A1* | 4/2013 | Wang | ...... | H01L 23/3128 257/659 |
| 2013/0323408 A1* | 12/2013 | Read | ...... | H01L 23/552 427/98.4 |
| 2013/0324069 A1* | 12/2013 | Chen | ...... | H04B 1/44 455/334 |
| 2014/0001471 A1* | 1/2014 | Li | ...... | H01L 23/552 257/48 |
| 2014/0016277 A1 | 1/2014 | Chen et al. | | |
| 2014/0085857 A1 | 3/2014 | Chen et al. | | |
| 2014/0175621 A1 | 6/2014 | Chen et al. | | |
| 2014/0231972 A1 | 8/2014 | Hsu et al. | | |
| 2014/0307394 A1 | 10/2014 | Lobianco et al. | | |
| 2015/0043189 A1 | 2/2015 | Kitazaki et al. | | |
| 2015/0070851 A1 | 3/2015 | Kitazaki et al. | | |
| 2015/0187705 A1* | 7/2015 | Chung | ...... | H01L 23/552 257/659 |
| 2015/0255402 A1 | 9/2015 | Hoang et al. | | |
| 2015/0271959 A1 | 9/2015 | Chen et al. | | |
| 2016/0093576 A1 | 3/2016 | Chiu et al. | | |
| 2016/0172309 A1 | 6/2016 | Gong et al. | | |
| 2016/0181206 A1 | 6/2016 | Read et al. | | |
| 2017/0025362 A1 | 1/2017 | Nguyen et al. | | |
| 2017/0040266 A1* | 2/2017 | Lin | ...... | H01L 23/5383 |
| 2017/0117229 A1* | 4/2017 | Kumbhat | ...... | H01L 23/552 |
| 2017/0118875 A1* | 4/2017 | Kumbhat | ...... | H01L 23/552 |
| 2017/0118877 A1* | 4/2017 | Kumbhat | ...... | H05K 1/181 |
| 2017/0179041 A1 | 6/2017 | Dias et al. | | |
| 2017/0186726 A1* | 6/2017 | Tang | ...... | H01L 21/565 |

OTHER PUBLICATIONS

Non-Final Office Action dated Aug. 24, 2017 for U.S. Appl. No. 14/920,798.

(56) References Cited

OTHER PUBLICATIONS

Non-Final Office Action dated Jun. 16, 2017 for U.S. Appl. No. 14/920,806.
Non-Final Office Action dated Jul. 3, 2017 for U.S. Appl. No. 14/920,817.
Final Office Action dated Dec. 12, 2011 for U.S. Appl. No. 14/920,806.
Notice of Allowance dated May 11, 2018 for U.S. Appl. No. 14/920,817.
Notice of Allowance dated Sep. 10, 2018, U.S. Appl. No. 14/920,817, 12 pgs.

* cited by examiner

CIRCUIT PACKAGE WITH SEGMENTED EXTERNAL SHIELD TO PROVIDE INTERNAL SHIELDING BETWEEN ELECTRONIC COMPONENTS

BACKGROUND

Small electronic components, including amplifiers, filters, transducers and the like, are employed in a number of devices, particularly in radio frequency (RF) wireless communications, for example. Various types of filters, for example, include acoustic filters, such as surface acoustic wave (SAW) resonator devices containing SAW resonators, and bulk acoustic wave (BAW) resonator devices containing thin film bulk acoustic resonators (FBARs) and solidly mounted resonators (SMRs), for example.

Conventionally, the electronic components are combined in circuit packages and covered with external shields to form discrete shielded packages, referred to as "modules." The external shields are generally shield layers that cover the top and sidewalls of the circuit packages, and provide protection against externally generated electromagnetic radiation ("external electromagnetic radiation"), as well as and environmental stresses, such as temperature, humidity, and physical impact, for example (e.g., hermetic sealing). In order to provide protection against the external electromagnetic radiation, the external shields are formed of electrically conductive material, typically metal. The bottoms of the circuit packages are typically not shielded by the external shield layers, although the substrate itself, external connecting pins protruding from the substrate and/or various electronic components, transmission lines and other circuitry within the substrate generally may provide some external shielding from external electromagnetic radiation. The external shield layers together with the bottom shielding together provide a "global shield" for the module.

One drawback of the external shield covering the circuit package is that it provides no shielding of individual electronic components from internally generated electromagnetic radiation ("internal electromagnetic radiation") produced by other electronic components within the circuit package, causing electromagnetic interference, such as capacitive and inductive coupling and other cross-talk. Indeed, the external shield, in some cases, may aggravate the electromagnetic interference by reflecting the internal electromagnetic radiation back toward the electronic components within the circuit package. Another related drawback of the external shield is that it restricts design freedom required to optimize for best shielding for each of the individual electronic components, device placement within the module and overall module size.

Accordingly, there is a need for enhanced shielding among and between electronic components within a shielded circuit package or module, which does not unduly restrict design freedom with regard to placement of the electronic components, size of the module and other features.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
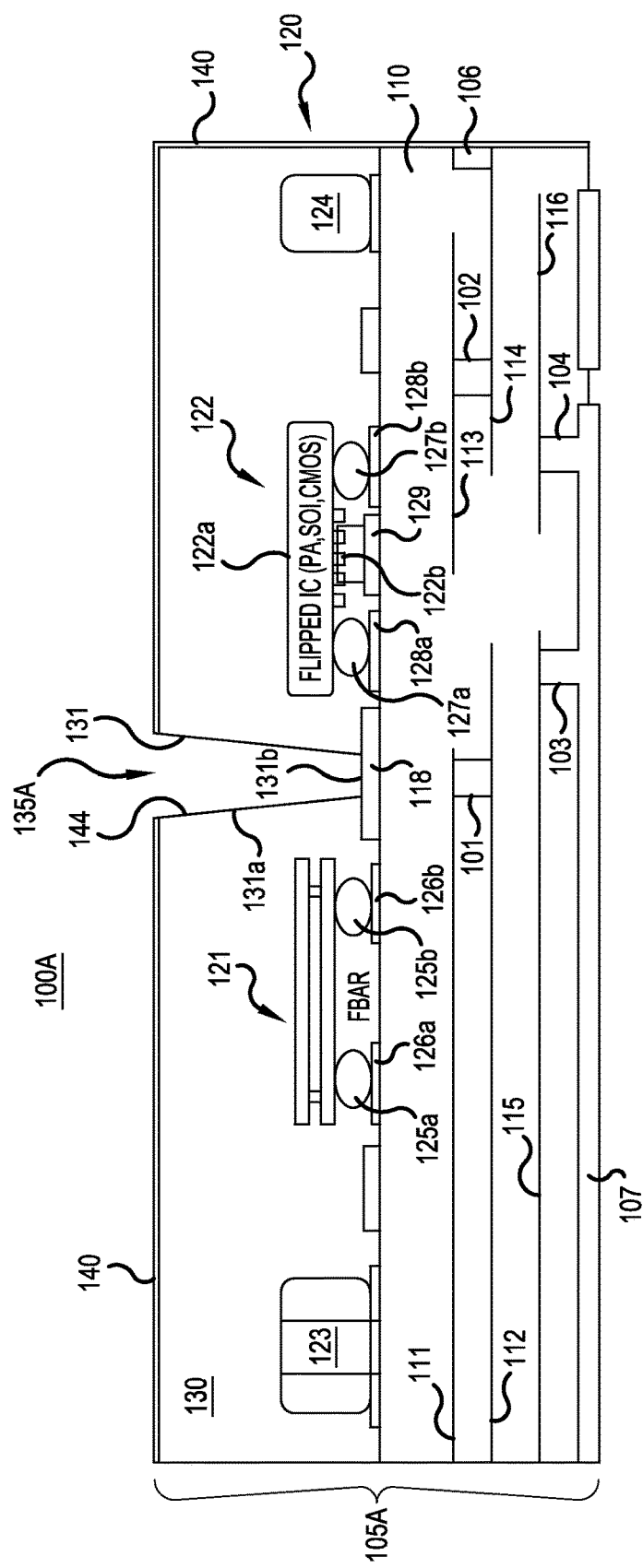
FIG. 1A is a simplified cross-sectional view of a module including a full trench as an internal shield, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

In various representative embodiments, a circuit package includes multiple electronic components on a substrate that generate electromagnetic radiation, and internal shielding among the electronic components, to reduce or eliminate electromagnetic interference caused by other the electronic components in the circuit package. Generally, the circuit package is included in a module having an external shield disposed on at least one outer surface of the circuit package and electrically connected to ground in order to reduce or eliminate external electromagnetic interference, although the internal shields may be present with or within an external shield.

FIGS. 1A to 1D are simplified cross-sectional views of a module including a circuit package, in which shielding from electromagnetic interference between electronic components is accomplished through incorporation of trench features formed in molded compound and lined with and/or at least partially filled with electrically conductive material, according to representative embodiments.

FIG. 1A, in particular, is a simplified cross-sectional view of module 100A including a full trench 131 as the trench feature for internal electromagnetic shielding. Referring to FIG. 1, the module 100A includes a circuit package 105A, which includes a substrate 110, multiple electronic components 120 assembled or formed on the substrate 110, and molded compound 130 disposed over the substrate 110 and the electronic components 120. The module 100A may further include an external shield 140, as in the depicted embodiment, disposed on at least one outer surface of the circuit package 105A, and electrically connected to ground, such that the module 100A is a shielded module. The external shield 140 is configured to protect the circuit package 105A (and the electronic components 120 within the circuit package 105A) from external electromagnetic radiation, environmental stress, and the like.

The substrate 110 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example. The substrate 110 includes embedded circuitry, indicated by representative traces 111, 112, 113, 114, 115 and 116, interconnected by representative vias 101, 102, 103 and 104. In the depicted embodiment, ground plane 107 is provided on a bottom surface of the substrate 110. Of course, alternative arrangements of traces, vias, terminals, ground planes and other electrical circuitry may be included in or on the substrate 110, to provide unique benefits for any particular situation or to meet application specific design requirements of various implementations, without departing from the scope of the present teachings.

In the depicted embodiment, representative electronic components 120 assembled or formed on the substrate 110 include, for purposes of illustration, an acoustic filter 121, a flipped chip integrated circuit (IC) 122, and surface mounted technology (SMT) components 123 and 124, although other types of electronic components 120 may be included, such as wirebond dies, without departing from the scope of the present teachings. The acoustic filter 121 may be referred to as a first electronic component, the flipped chip IC 122 may be referred to as a second electronic component, the SMT component 123 may be referred to as a third electronic component, and the SMT component 124 may be referred to as a fourth electronic component. For purpose of discussion, it may be assumed that some or all of the first through fourth electronic components to produce varying amounts electromagnetic radiation, and also have varying levels of sensitivity to such electromagnetic radiation. Examples of the acoustic filter 121 include SAW resonator devices containing SAW resonators, and bulk acoustic wave (BAW) resonator devices containing FBARs and/or SMRs. Examples of the flipped chip IC 122 include power amplifiers, complementary metal-oxide semiconductor (CMOS) circuits and integrated silicon-on-insulator (SOI) circuits. Of course, the number and types of electronic components 120 are not limited, and thus may vary without departing from the scope of the present teachings.

As mentioned above, the molded compound 130 is disposed over the substrate 110 and the electronic components 120 (e.g., the acoustic filter 121, the flipped chip IC 122, and the SMT components 123 and 124). The molded compound 130 may be formed of a reinforced or non-reinforced epoxy resin, for example, and may be applied using any process compatible with fabrication of semiconductor devices, such as injection molding, transfer molding, or compression molding, for example. The molded compound 130 generally protects the electronic components 120 and provides additional structural support to the module 100A. In various embodiments, the molded compound 130 may hermetically seal the electronic components 120 within the circuit package 105A.

In the depicted embodiment, the acoustic filter 121 is an FBAR filter electrically connected to ground and/or other electronic circuitry via joints 125a and 125b, which may be made of solder, a combination of a copper pillar and solder, or other joining technique, and respective pads 126a and 126b arranged on or in the substrate 110. The other electronic circuitry to which the acoustic filter 121 may be electrically connected may include, for example, the traces 111, 112, 113, 114, 115 and 116 interconnected by the vias 101, 102, 103 and 104, as well as the ground plane 107. It is assumed for purposes of illustration that the acoustic filter 121 is particularly sensitive to electromagnetic radiation, as mentioned above.

The flipped chip IC 122 includes a die substrate 122a with electronic circuitry 122b mounted on and/or at least partially in the die substrate 122a, generally on the side of the die substrate 122a facing toward the substrate 110 (e.g., the bottom surface, as shown in FIG. 1A). Again, the electronic circuitry 122b is electrically connected to ground and/or other electronic circuitry via joints 127a and 127b, which may be made of solder, a combination of a copper pillar and solder, or other joining technique, and respective pads 128a and 128b arranged on or in the substrate 110. An optional pillar 129 for enhancing heat dissipation from the flipped chip IC 122 is also shown. The other electronic circuitry to which the first and second electronic circuitry 121*b* and 122*b* may be electrically connected may include, for example, the traces 111, 112, 113, 114, 115 and 116 interconnected by the vias 101, 102, 103 and 104, as well as the ground plane 107.

It is assumed, for purposes of illustration, that the electronic circuitry 122*b* generates a significant amount electromagnetic radiation, e.g., as compared to the acoustic filter 121, for example, thereby potentially subjecting the acoustic filter 121 to electromagnetic interference (e.g., cross-talk). This electromagnetic interference is typically enhanced by the fact that both the flipped chip IC 122 and the acoustic filter 121 are enclosed within the external shield 140, which causes internal reflection and further electromagnetic interference from the internal electromagnetic radiation. Accordingly, a representative internal shield 135A in the form of a trench feature is provided within the circuit package 105A between the flipped chip IC 122 and the acoustic filter 121. The internal shield 135A thereby reduces or eliminates electromagnetic interference and otherwise enhances isolation between the flipped chip IC 122 and the acoustic filter 121.

In the depicted embodiment, the a trench feature is a full trench 131, defined by the molded compound 130, that extends from a top surface of the molded compound 130, through the molded compound 130, to the substrate 110 or to a pad 118 formed on or at least partially in the substrate 110 or to a conductive or non-conductive material dispensed on the pad 118. An electrically conductive trench coating 144 (e.g., metal, or a combination of conductive and non-conductive materials) is applied to at least a portion of the sidewalls 131*a*. In various configurations, the conductive trench coating 144 may also cover the bottom 131*b* of the full trench 131. When the trench coating 144 is covers the bottom 131*b* of the full trench 131, it physically contacts the pad 118 (conductive material dispensed on the pad 118), forming an electrical connection to ground. Therefore, the internal shield 135A is electrically grounded. Also, in the depicted embodiment, the external shield 140 is connected or otherwise integrated with the trench coating 144, such that the external shield 140 is also electrically grounded through the pad 118, as well as through a ground terminal 106 exposed at the side outer surface of the substrate 110 and connected to a metal plane (e.g., trace 114) in the circuit package 105A. In an alternative embodiment, the pad 118 may be omitted, and thus the bottom 131*b* of the full trench 131 physically contacts a top surface of the substrate 110, or the pad 118 remains in place but is covered by a non-conductive material or is otherwise not electrically connected to ground. In these configurations, the trench coating 144 within the full trench 131 (and thus the internal shield 135A) is also grounded through the same ground terminal 106 by its connection or integration with the external shield 140. Although the full trench 131 is shown with sloped sidewalls 131*a*, it is understood that the full trench 131 may have any cross-sectional shape (typically a function of the fabrication technique used to form the trench) without departing from the scope of the present teachings.

Each of the grounded external shield 140 and the trench coating 144 are formed of a conductive material (e.g., metal), such as stainless steel, copper (Cu), silver (Ag), gold (Au), or aluminum (Al), for example, or a combination of conductive and non-conductive materials. Depending on the material or combination of conductive materials or conductive and non-conductive (e.g., dielectric materials), the trench coating 144 may block the electromagnetic radiation and/or absorb the electromagnetic radiation. The external shield 140 and the trench coating 144 may be formed of the same material(s), or different material(s), or combinations of material, without departing from the scope of the present teachings. The external shield 140 may be a conformal metal coat, for example, applied to the surfaces of the circuit package 105A through a sputtering operation. The same sputtering operation may also cover the sidewalls 131*a* and/or the bottom 131*b* of the full trench 131. However, the covering on the sidewalls 131*a* and/or the bottom 131*b* of the full trench 131 may not be thick enough following this sputtering operation, and therefore additional processes for covering and/or filling the full trench 131 may be required, as would be apparent to one of ordinary skill in the art. In various configurations, the external shield 140 may also include a stainless steel (SUS) finish to improve aesthetics and enhance resistance to oxidation and other contamination.

The top portion of the external shield 140 may have a thickness of about 1 µm to about 50 µm, and the sidewall(s) of the external shield 140 may have a thickness of about 0.1 µm to about 25 µm, for example, although other thicknesses and combinations of thicknesses may be incorporated without departing from the scope of the present teachings. When the full trench 131 is conformally coated, for example, the trench coating 144 on the sidewalls 131*a* of the full trench 131 may have a thickness of about 0.01 µm to about 25 µm, and the trench coating 144 on the bottom 131*b* of the full trench 131 may have a thickness of about 0.1 µm to about 50 µm, for example, although other thicknesses and combinations of thicknesses may be incorporated without departing from the scope of the present teachings. When the full trench 131 is fully or partially filled, then coating is not necessarily needed on the sidewalls 131*a*.

As previously mentioned, in various alternative configurations, the full trench 131 may be filled (not shown), or at least partially filled (not shown), with conductive material, e.g., which may be referred to as "filler material," in addition to or in place of the trench coating 144. In other words, the full trench 131 filled with the conductive material may form a sort of electrically grounded plug that functions as the internal shield 135A. The filler material may effectively enhance the electrical connection between the internal shield 135A and the external shield 140, thereby enhancing the electrical connection between the internal shield 135A and ground. The filler material also provides a thicker, solid metal barrier to act as the internal shield.

Generally, the external shield 140 protects the electronic components 120 from external electromagnetic radiation and environmental stress. The internal shield 135A protects the acoustic filter 121 and the flipped chip IC 122 from internal electromagnetic radiation (e.g., generated by one or both), reducing internal electromagnetic interference and improving overall performance of the module 100A.

Figure 1B:
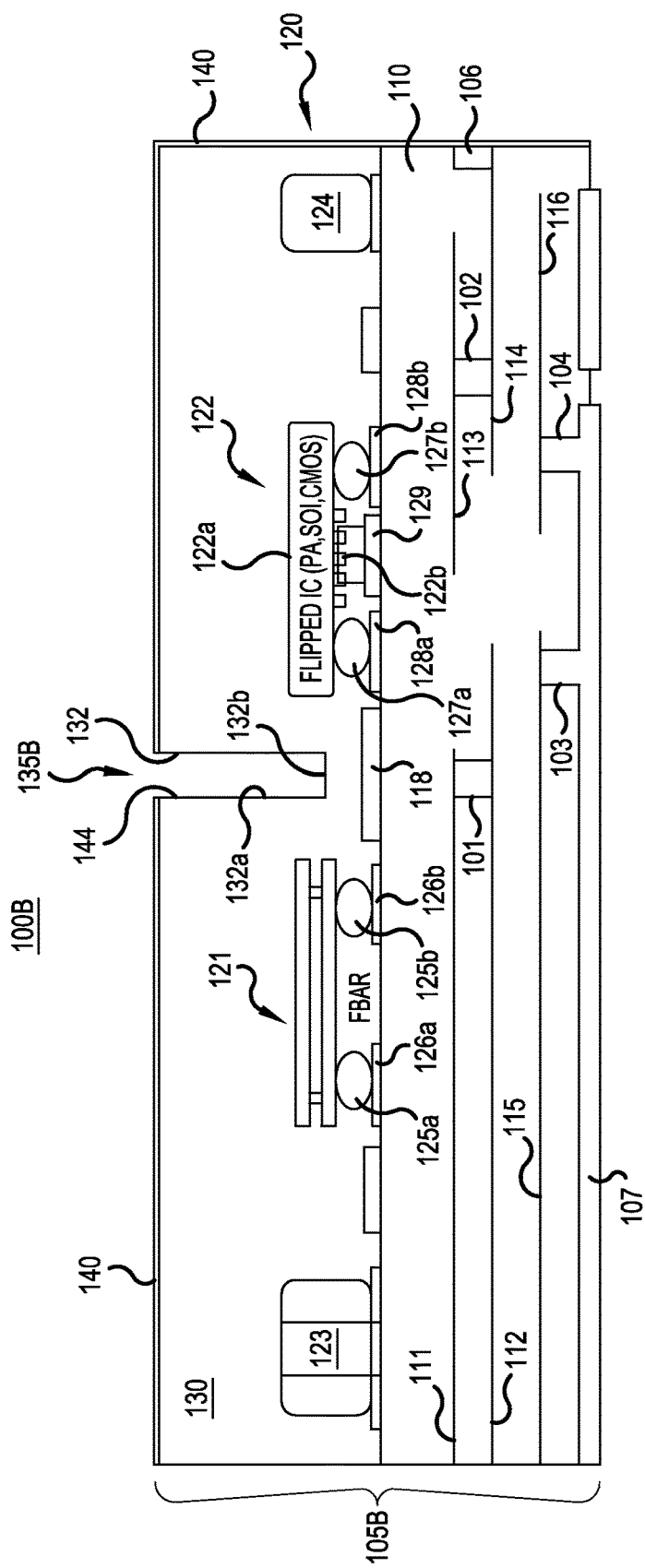
FIG. 1B is a simplified cross-sectional view of a module including a partial trench as an internal shield, according to a representative embodiment.

FIG. 1B is a simplified cross-sectional view of module 100B including a partial trench 132 as the trench feature for internal electromagnetic shielding. Referring to FIG. 1B, the module 100B includes a circuit package 105B, which includes the substrate 110, the multiple electronic components 120, and molded compound 130 disposed over the substrate 110 and the electronic components 120. The module 100B further includes the external shield 140 disposed on at least one outer surface of the circuit package 105B, and electrically connected to ground, such that the module 100B is a shielded module.

As discussed above, in the depicted embodiment, representative electronic components 120 assembled or formed on the substrate 110 include, for purposes of illustration, the acoustic filter 121, the flipped chip IC 122, and SMT components 123 and 124, which produce varying amounts electromagnetic radiation and have varying levels of sensitivity to such electromagnetic radiation. The molded compound 130 is disposed over the substrate 110 and the electronic components 120, and may be formed of an epoxy resin, for example, applied using any process compatible with fabrication of semiconductor devices, as discussed above with reference to the molded compound 130.

A representative internal shield 135B in the form of a trench feature is provided within the circuit package 105B between the flipped chip IC 122 and the acoustic filter 121. In the depicted embodiment, the trench feature is a partial trench 132 (as opposed to a full trench 131, as shown in FIG. 1A) that extends from a top surface of the molded compound 130, through a portion of the molded compound 130, ending short of the substrate 110 and/or the pad 118. An electrically conductive trench coating 144 (e.g., metal) is applied to at least a portion of the sidewalls 132a and/or the bottom 132b of the partial trench 132. In various configurations, the partial trench 132 may be fully or partially filled with electrically conductive filler material. The partial trench 132 is connected to the external shield 140 for grounding, through the electrically conductive trench coating 144 on the sidewalls 132, through electrically conductive filler material or a combination of both. As shown in this embodiment, the partial trench 132 extends far enough through the molded compound 130 such that conductive material (e.g., the trench coating 144 and/or filler material) is placed between the active portions of the flipped chip IC 122 and the acoustic filter 121 (but not necessarily between the respective connectors, such as the joints 125a, 125b, 127a and 127b, for example). This arrangement enables the internal shield 135B to provide electromagnetic shielding between the more susceptible parts of the flipped chip IC 122 and the acoustic filter 121 without having to form a trench (i.e., partial trench 132) through the entire molded compound 130. However, depending upon performance and internal shielding requirements, the partial trench depth may vary, without departing from the scope of the present teachings.

Notably, because the partial trench 132 is formed only partially through the molded compound 130, the bottom 132b of the partial trench 132 does not physically contact the pad 118, and therefore does not form an electrical connection to ground via the pad 118. Therefore, the internal shield 135B is electrically ground through the external shield 140, which may be grounded at a ground terminal 106, for example, exposed on the side outer surface of the substrate 110 in the circuit package 105B. More particularly, the trench coating 144 within the partial trench 132 is connected to or integrated with the external shield 140, and therefore the partial trench 132 (and thus the internal shield 135B) is also grounded through the same ground terminal 106. In this embodiment, the pad 118 may be omitted. Although the partial trench 132 is shown with parallel sidewalls 132a, it is understood that the partial trench 132 may have any cross-sectional shape (typically a function of the fabrication technique used to form the trench) without departing from the scope of the present teachings.

The top portion of the external shield 140 may have a thickness of about 1 μm to about 50 μm, and the sidewall(s) of the external shield 140 may have a thickness of about 0.1 μm to about 25 μm, for example, although other thicknesses and combinations of thicknesses may be incorporated without departing from the scope of the present teachings. The trench coating 144 on the sidewalls 132a of the partial trench 132 may have a thickness of about 0.01 μm to about 25 μm, and the trench coating 144 on the bottom 132b of the partial trench 132 may have a thickness of about 0.1 μm to about 50 μm, for example, although other thicknesses and combinations of thicknesses may be incorporated without departing from the scope of the present teachings. The thicknesses may depend, in part, on the depth of the partial trench 132. Also, in various alternative configurations, the partial trench 132 may be filled (not shown), or at least partially filled (not shown), with conductive material, in addition to or in place of the trench coating 144. In other words, the partial trench 132 filled with the conductive material may form a sort of electrically grounded plug that functions as the internal shield 135B. When the full trench 131 is fully or partially filled, then coating is not necessarily needed on the sidewall s 131a.

Figure 1C:
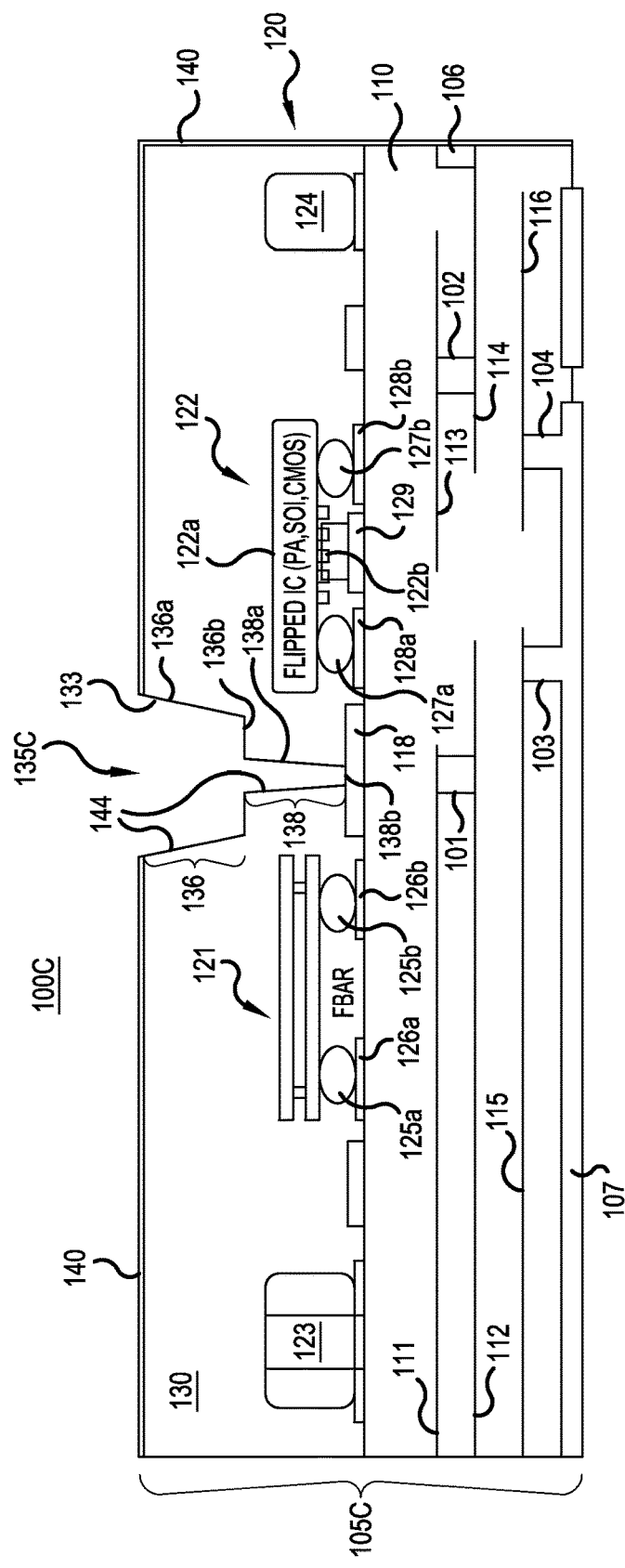
FIG. 1C is a simplified cross-sectional view of a module including a hybrid trench as an internal shield, according to a representative embodiment.

FIG. 1C is a simplified cross-sectional view of module 100C including a hybrid trench 133 as the trench feature for internal electromagnetic shielding. Referring to FIG. 1C, the module 100C includes a circuit package 105C, which includes the substrate 110, the multiple electronic components 120, and molded compound 130 disposed over the substrate 110 and the electronic components 120. The module 100C further includes the external shield 140 disposed on at least one outer surface of the circuit package 105C, and electrically connected to ground, such that the module 100C is a shielded module.

As discussed above, in the depicted embodiment, representative electronic components 120 assembled or formed on the substrate 110 include, for purposes of illustration, the acoustic filter 121, the flipped chip IC 122, and the SMT components 123 and 124, which produce varying amounts electromagnetic radiation and have varying levels of sensitivity to such electromagnetic radiation. The molded compound 130 is disposed over the substrate 110 and the electronic components 120.

A representative internal shield 135C in the form of a trench feature is provided within the circuit package 105C between the flipped chip IC 122 and the acoustic filter 121. In the depicted embodiment, the trench feature is a hybrid trench 133 (as opposed to a full trench 131 as shown in FIG. 1A, or a partial trench 132 as shown in FIG. 1B), including an upper trench portion 136 and a lower trench portion 138. The upper trench portion 136 of the hybrid trench 133 extends from the top surface of the molded compound 130, partially through the molded compound 130, ending short of the substrate 110. The lower trench portion 138 extends from a bottom of the upper trench portion 136 to the substrate 110 or a pad 118 located on or at least partially in the substrate 110 or to a conductive or non-conductive material dispensed on the pad 118. In the depicted embodiment, a cross-section of the upper trench portion 136 is wider than a cross-section of the lower trench portion 138.

Therefore, the complete hybrid trench 133 extends from the top surface of the molded compound 130, through the molded compound 130, to the substrate 110 or to a pad 118 formed on or at least partially in the substrate 110 or to a conductive or non-conductive material dispensed on the pad 118. An electrically conductive trench coating 144 (e.g., metal) is applied to at least a portion of the sidewalls 136a and/or the sidewalls 138a. In various configurations, the trench coating 144 may also cover the bottom 136b of the upper trench portion 136 and/or the bottom 138b of the lower trench portion 138. When the hybrid trench 133 is fully or partially filled, then coating is not necessarily needed on the sidewalls 136a or 138a. The trench coating 144 at the bottom 138b of the lower trench portion 138 physically contacts the pad 118, forming an electrical connection to ground. Therefore, the internal shield 135C is electrically grounded. Also, in the depicted embodiment, the external shield 140 is connected or otherwise integrated with the trench coating 144, such that the external shield 140 is also electrically grounded through the pad 118, as well as through a ground terminal 106 exposed at the side outer surface of the substrate 110 and connected to a metal plane (e.g., trace 114) in the circuit package 105A. In an alternative embodiment, the pad 118 may be omitted, and thus the bottom 138b of the hybrid trench 133 physically contacts a top surface of the substrate 110, or the pad 118 remains in place but is covered by a non-conductive material or is otherwise not electrically connected to ground, as discussed above. In these configurations, the trench coating 144 within the hybrid trench 133 (and thus the internal shield 135C) is also grounded through the same ground terminal 106 by its connection or integration with the external shield 140. In another embodiment, the hybrid trench 133 does not extend fully to the pad 118 and/or the substrate 110, in which case the pad 118 may be omitted or remain present but not necessarily be electrically connected to ground. Although the hybrid trench 133 is shown with sloped sidewalls 136a and 138a of the upper and lower trench portions 136 and 138, respectively, it is understood that each of the upper and lower trench portions 136 and 138 may have any cross-sectional shape (typically a function of the fabrication technique used to form the trench portion) without departing from the scope of the present teachings.

As mentioned above, each of the grounded external shield 140 and the trench coating 144 are formed of a conductive material (e.g., metal), such as copper (Cu), silver (Ag), gold (Au), or aluminum (Al), for example or a combination of conducting and non conducting materials. The external shield 140 and the trench coating 144 may be formed of the same conductive material, or different conductive materials, without departing from the scope of the present teachings. The upper trench portion 136 may be formed by any trenching process compatible with semiconductor fabrication, an example of which is discussed below with reference to FIG. 2. The lower trench portion 138 may be formed by laser grooving or mechanical drilling, for example, after application of the molded compound 130 and formation of the upper trench portion 136.

The top portion of the external shield 140 may have a thickness of about 1 μm to about 50 μm, and the sidewall(s) of the external shield 140 may have a thickness of about 0.1 μm to about 25 μm, for example, although other thicknesses and combinations of thicknesses may be incorporated without departing from the scope of the present teachings. When the hybrid trench 133 is conformally coated, for example, trench coating 144 on the sidewalls 136a of the upper trench portion 136 and the sidewalls 138a of the lower trench portion 138 may have thicknesses of about 0.01 μm to about 25 μm, for example, and the trench coating 144 on the bottom 136b of the upper trench portion 136 and the bottom 138b of the lower trench portion 138 may have thicknesses of about 0.1 μm to about 50 μm, for example. Of course, other thicknesses and combinations of thicknesses may be incorporated without departing from the scope of the present teachings.

As previously mentioned, in various alternative configurations, the hybrid trench 133 may be filled (not shown), or at least partially filled (not shown) with conductive material, in addition to or in place of the trench coating 144. For example, the lower trench portion 138 may be entirely filled with a conductive material, while the upper trench portion 136 may contain little to no fill, but still have the trench coating 144 (e.g., connecting the fill in the lower trench portion 138a with the external shield 140. In other words, the lower trench portion 138 filled with the conductive material may form a sort of electrically grounded plug that functions as the internal shield 135A, along with the coated sidewalls 136a and bottom 136b of the upper trench portion 136. An advantage of the hybrid trench is that it may be easier to coat the sidewalls 136a, 138a and easier to fill with filler material (particularly in the narrower lower trench portion 138) than the other types of trenches.

Figure 1D:
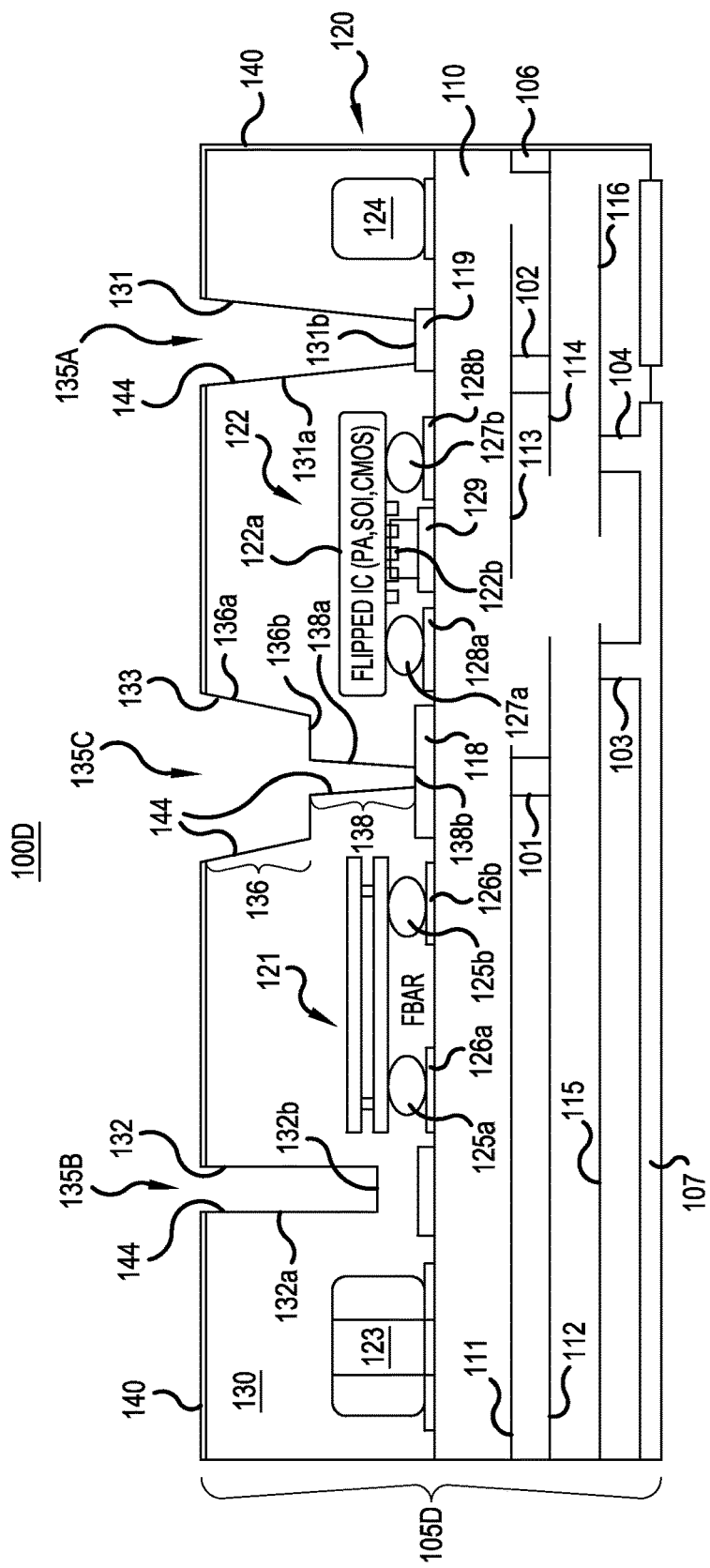
FIG. 1D is a simplified cross-sectional view of a module including a full trench, a partial trench and a hybrid trench as internal shields, respectively, according to a representative embodiment.

In various embodiments, the circuit package may include multiple internal shields formed between multiple sets of adjacent electronic components 120, respectively. Also, the multiple internal shields may be the same or different types of internal shields. For example, FIG. 1D is a simplified cross-sectional view of module 100D including three internal shields having trench features of different types: a full trench 131, a partial trench 132, and a hybrid trench 133 providing internal shield 135A, internal shield 135B and internal shield 135C, respectively. In the depicted example, the full trench 131 is formed between the flipped chip IC 122 and the SMT component 124, the partial trench 132 is formed between the SMT component 123 and the acoustic filter 121, and the hybrid trench 133 is formed between the acoustic filter 121 and the flipped chip IC 122, although different arrangements of types and locations of the various trench features may be implemented without departing from the scope of the present teachings.

FIGS. 2A to 2E are simplified cross-sectional views showing an illustrative method of fabricating modules with trench features to be used as internal shields, according to a representative embodiment.

Figure 2A:
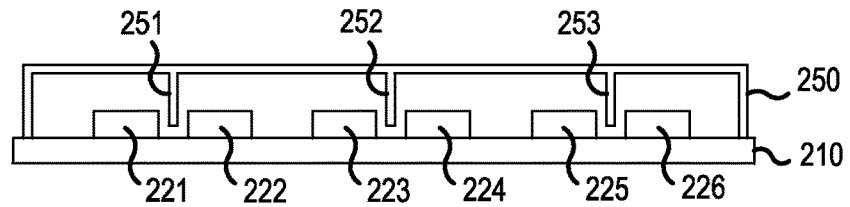
FIGS. 2A to 2E are simplified cross-sectional views showing an illustrative method of fabricating modules with trench features to be used as internal shields, according to a representative embodiment.

Referring to FIG. 2A, multiple electronic components 221 to 226 are assembled or formed on a substrate 210. A mold tool 250 having multiple protrusions 251 to 253 (or, at least one protrusion) is clamped to the substrate 210 (which may also be referred to as a wafer or printed circuit board at this stage in the fabrication process). The substrate 210 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example. The mold tool 250 is configured such that each of the protrusions 251 to 253 extends downwardly toward the substrate 210 between adjacent electronic components 221 to 226, respectively, in order to ultimately produce corresponding trenches, as discussed below. The electronic components 221 to 226 may be any of a variety of types, such as acoustic filers, flipped chip ICs, and/or SMT components, for example, as discussed above.

More particularly, the protrusion 251 extends between the electronic components 221 and 222, the protrusion 252 extends between the electronic components 223 and 224, and the protrusion 253 extends between the electronic components 225 and 226. The length and shape of each of the mold tool protrusions 251 to 253 are designed to provide the type of trench desired. For example, the mold tool protrusions 251 to 253 have parallel sides and do not extend fully to the surface of the substrate 210, thus being configured to create partial trenches with parallel sidewalls, as discussed below.

Figure 2B:
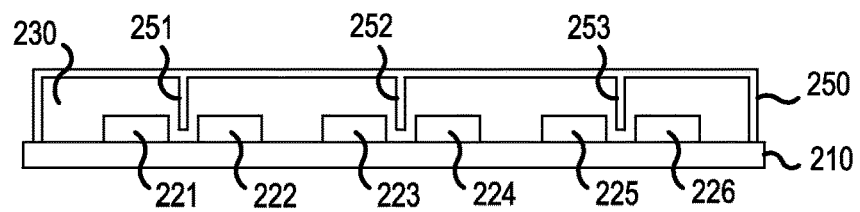
Figure 2C:
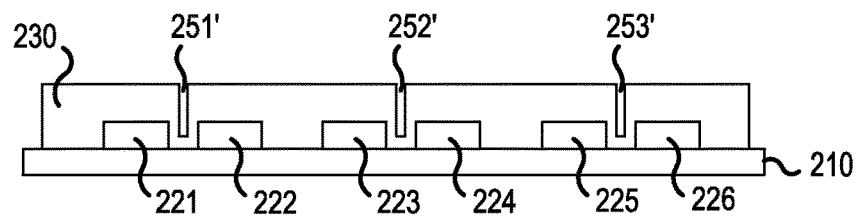

In FIG. 2B, a molded compound 230 is injected into the mold tool 250, filling the spaces among the mold tool protrusions 251 to 253, the electronic components 221 to 226, and the top surface of the substrate 210, encapsulating the same. The substrate 210 with the addition of the molded compound 230 may be referred to a molded substrate 210. The molded compound 230 may be formed of an epoxy resin, which is applied in a liquid or viscous state, and then allowed to set to provide the solid molded compound 230. In FIG. 2C, the mold tool 250 has been removed, leaving partial trenches 251', 252' and 253' in the molded compound 230 corresponding to the protrusions 251, 252 and 253, respectively, such that the molded compound defines the partial trenches 251', 252' and 253'.

Figure 2D:
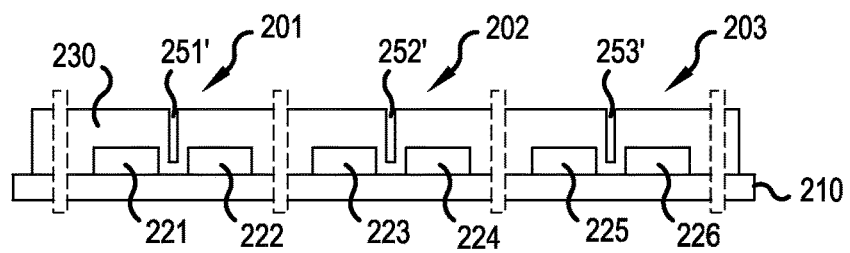

Referring to FIG. 2D, the molded substrate 210 (or wafer) is singulated into multiple circuit packages 201, 202 and 203, each of which includes two electronic components separated by a partial trench. For example, circuit package 201 includes electronic components 221 and 222 separated by partial trench 251', circuit package 202 includes electronic components 223 and 224 separated by partial trench 252', and circuit package 203 includes electronic components 225 and 226 separated by partial trench 253'. The substrate 210 may be singulated by any process compatible with semiconductor processes, such as sawing or laser etching, for example.

Figure 2E:
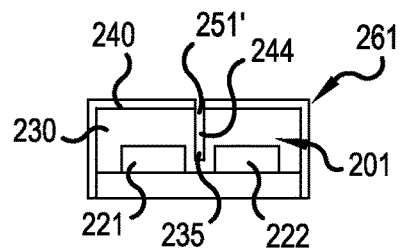

As indicated in FIG. 2E, a conductive material, such as a conformal coating of metal, for example, is applied to the outer surfaces of each of the circuit packages 201, 202 and 203 (although only circuit package 201 is shown for purposes of convenience) to provide an external shield 240, thereby creating corresponding modules (e.g., module 261). Referring to FIG. 2E, the external shield 240 is configured to protect the circuit package 201 from external electromagnetic radiation, as well as various environmental stresses, such as temperature and moisture. As discussed above, the external shield 140 is formed of an electrically conductive material, such as such as copper (Cu), silver (Ag), gold (Au), or aluminum (Al), for example, applied to the surface(s) of the circuit package 201, e.g., by a sputtering operation.

Application of the electrically conductive material also results in trench coating 244 on the sidewalls and bottom of the partial trench 251'. The coated partial trench 251' provides an internal shield 235 for protecting the electronic components 221 and 222 against internal electromagnetic radiation (e.g., generated by one another). Each of the external shield 240 and the internal shield 235 are electrically grounded. Since the trench feature in the depicted example is a partial trench 251', both the external shield 240 and the internal shield 235 may be electrically grounded via a ground terminal (not shown) exposed on an outer surface of the substrate 210 in the circuit package 201, similar to the ground terminal 106 discussed above with respect to FIG. 1B.

In addition to trench features coated or filled with metal, for example, other types of internal shields may be provided without forming one or more trenches in a molded compound. For example, FIGS. 3A and 3B are simplified cross-sectional views of a modules including a circuit package, in which shielding from electromagnetic interference between electronic components is accomplished by bond wires, thereby enhancing isolation, according to representative embodiments.

Figure 3A:
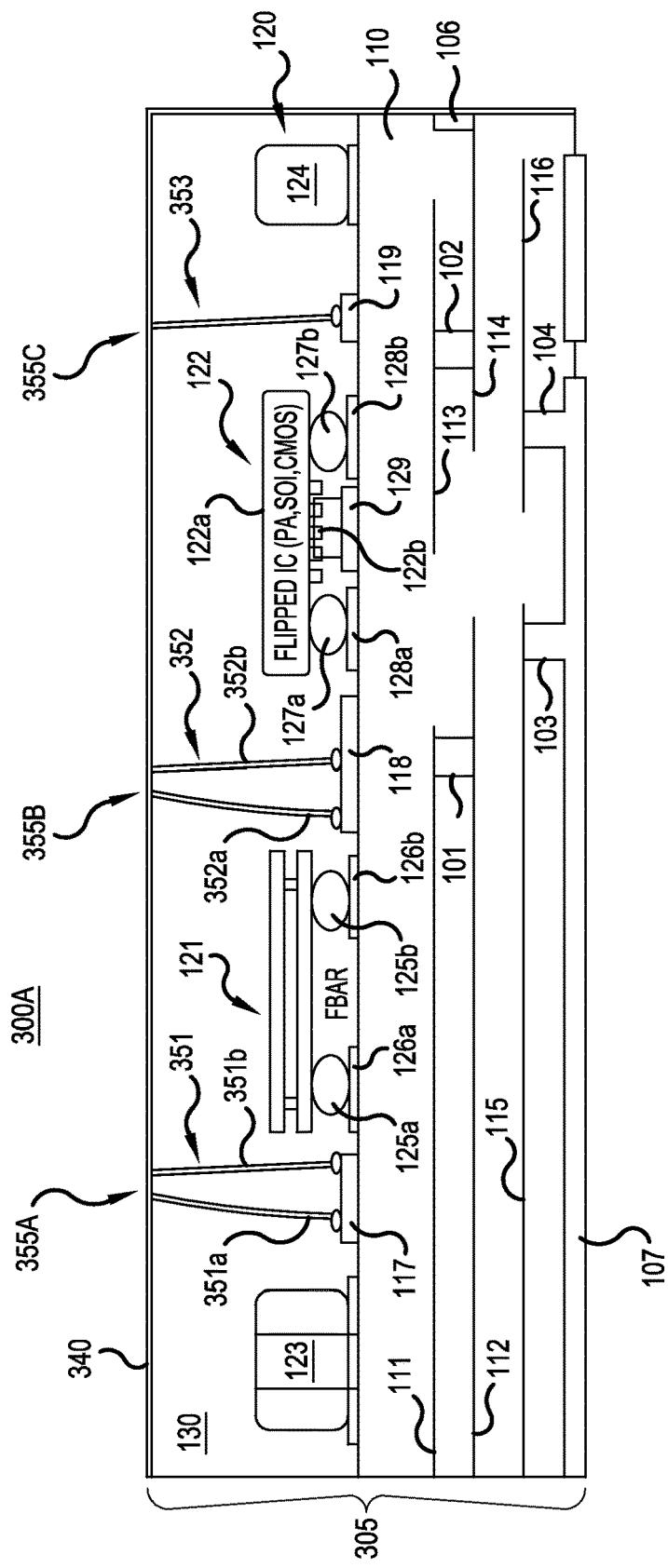
FIG. 3A is a simplified cross-sectional view of a module including truncated bond wires as internal shields, respectively, according to a representative embodiment.
Figure 3B:
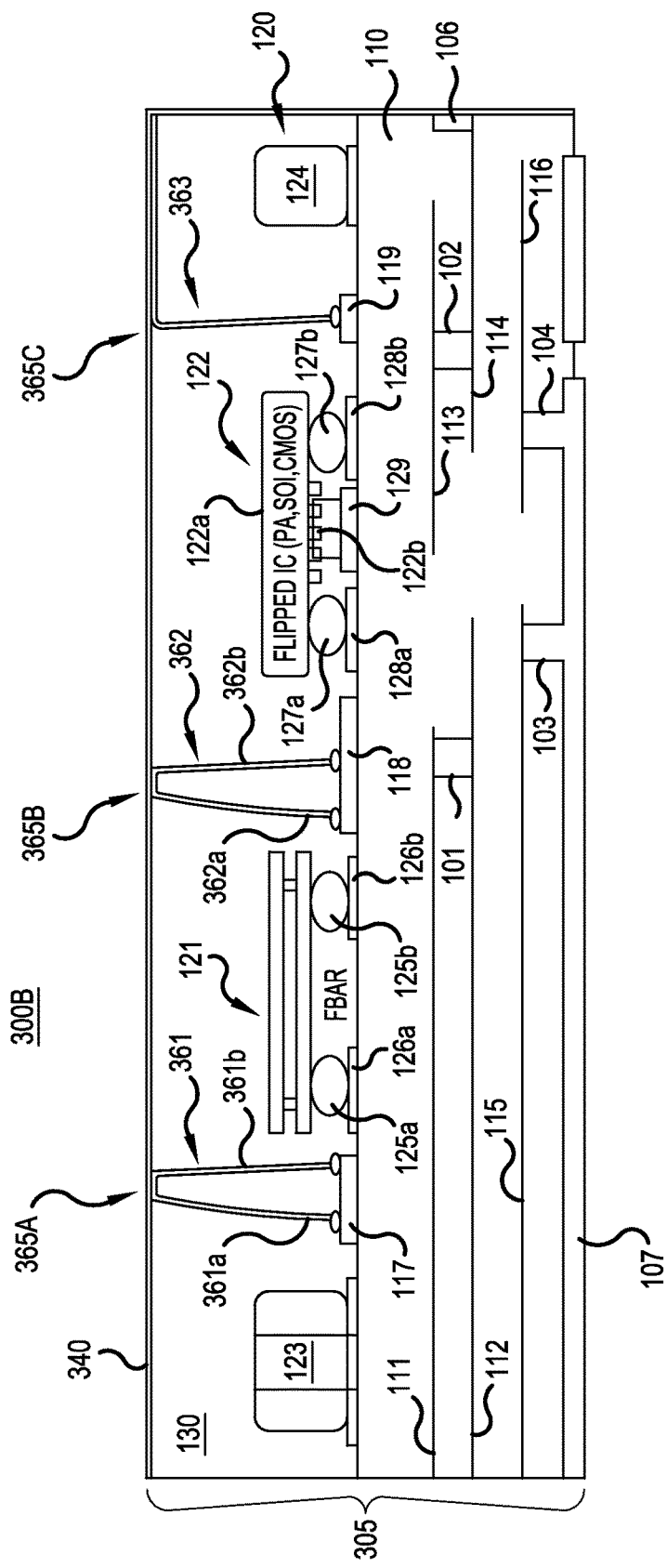
FIG. 3B is a simplified cross-sectional view of a module including flattened bond wires as internal shields, respectively, according to a representative embodiment.

Referring to FIG. 3A, module 300A includes truncated bond wires 351, 352 and 353 as internal electromagnetic shielding. In particular, the module 300A includes a circuit package 305, which includes substrate 110, multiple electronic components 120 assembled or formed on the substrate 110, and molded compound 130 disposed over the substrate 110 and the electronic components 120. The module 300A further includes external shield 340 disposed on at least one outer surface of the circuit package 305, and electrically connected to ground, such that the module 300A is a shielded module. The external shield 340 is configured to protect the circuit package 305 (and the electronic components 120 within the circuit package 305) from external electromagnetic radiation, environmental stress, and the like.

As discussed above, the substrate 110 may be formed of any material compatible with semiconductor processes, and includes embedded circuitry, indicated by representative traces 111, 112, 113, 114, 115 and 116, interconnected by representative vias 101, 102, 103 and 104. In the depicted embodiment, ground terminal 106 is exposed on the side outer surface of the substrate 110 and ground plane 107 is provided on a bottom surface of the substrate 110. Of course, alternative arrangements of traces, vias, terminals, ground planes and other electrical circuitry may be included in or on the substrate 110, to provide unique benefits for any particular situation or to meet application specific design requirements of various implementations, without departing from the scope of the present teachings.

In the depicted embodiment, representative electronic components 120 assembled or formed on the substrate 110 include, for purposes of illustration, an acoustic filter 121, a flipped chip IC 122, and SMT components 123 and 124, as discussed above. Examples of the acoustic filter 121 include SAW resonator devices containing SAW resonators, and BAW resonator devices containing FBARs and/or SMRs. Examples of the flipped chip IC 122 include power amplifiers, CMOS circuits and integrated SOI circuits. Of course, the number and types of electronic components 120 are not limited, and thus may vary without departing from the scope of the present teachings.

The molded compound 130 is disposed over the substrate 110 and the electronic components 120, as well as the truncated bond wires 351, 352 and 353, as discussed below. The molded compound 130 generally protects the electronic components 120 and provides additional structural support to the module 300A. In various embodiments, the molded compound 130 may hermetically seal the electronic components 120 within the circuit package 305.

The truncated bond wires 351, 352 and 353 are disposed between adjacent electronic components 120, respectively (prior to application of the molded compound 130). Each of the truncated bond wires 351, 352 and 353 is formed of a conductive material, such as metal, compatible with semiconductor processes, such as gold (Au), silver (Ag), copper (Cu), palladium coated copper (PCC) or aluminum (Al), for example. The truncated bond wires 351, 352 and 353 may be formed of the same materials as one another, and/or as the external shield 340. Or, one or more of the truncated bond wires 351, 352 and 353, and the external shield 340 may be formed of different materials, without departing from the scope of the present teachings.

In the depicted embodiment, the truncated bond wire 351 is a truncated in that both ends of the bond wire 351 are initially connected to a pad 117, or to a conductive or non-conductive material dispensed on the pad 117, formed on or at least partially in the substrate 110 forming a loop, where the pad 117 may be electrically grounded. The molded compound 130 is then applied at a thickness less than a height of an apex or top portion of the loop, and thus the portion of the bond wire loop extending beyond the top surface of the molded compound 130 may be trimmed away prior to application of the external shield 340, resulting in a pair of separated bond wires 351a and 351b (collectively referred to as the truncated bond wire 351). Similarly, the molded compound 130 may be applied at a thickness greater than or equal to the height of the apex of the loop, and then the molded compound 130 may be trimmed (e.g., etched and/or planarized) down to a thickness less than the height of the apex prior to application of the external shield 340, again resulting in a pair of separated bond wires 351a and 351b.

After the external shield 340 is applied to the circuit package 305, each of the separated bond wires 351a and 351b is in connected between external shield 340 at one end and the pad 117, or to a conductive or non-conductive material dispensed on the pad 117, at the other end. When the pad 117 is connected to ground, the separated bond wires 351a and 351b, as well as the external shield 340, may be grounded via the pad 117. Alternatively, when the pad 117 is not connected to ground, the bond wires 351a and 351b, as well as the external shield 340, may be grounded via the ground terminal 106. The grounded bond wires 351a and 351b thus form an internal shield 355A between the SMR component 123 and the acoustic filter 121. The internal shield 355A blocks the internal electromagnetic radiation generated by the SMR component 123 and the acoustic filter 121, resulting in reduced electromagnetic interference in the other component.

The truncated bond wire 352 is also truncated, in that both ends of the truncated bond wire 352 are initially connected to the pad 118 formed on or at least partially in the substrate 110 forming a loop. The apex or top portion of the loop is subsequently removed, as discussed above, resulting in a pair of separated bond wires 352a and 352b. Each of the separated bond wires 352a and 352b is in connected between external shield 340 at one end and the pad 118, or to a conductive or non-conductive material dispensed on the pad 118, at the other end. When the pad 118 is connected to ground, the separated bond wires 352a and 352b, as well as the external shield 340, may be grounded via the pad 118. Alternatively, when the pad 118 is not connected to ground, the bond wires 352a and 352b, as well as the external shield 340, may be grounded via the ground terminal 106. The grounded bond wires 352a and 352b thus form an internal shield 355B between the acoustic filter 121 and the flipped chip IC 122. The internal shield 355B blocks the internal electromagnetic radiation generated by the acoustic filter 121 and the flipped chip IC 122, resulting in reduced electromagnetic interference in the other component.

The truncated bond wire 353 differs from truncated bond wires 351 and 352 in that only one separated bond wire 353a (of a pair of separated bond wires following truncation) is connected between external shield 340 at one end and the pad 119, or to a conductive or non-conductive material dispensed on the pad 119, at the other end. This results from the loop of the truncated bond wire 353 initially being formed over the SMT component 124, as discussed below with reference to FIG. 4B. The other bond wire (not shown) of the pair of separated bond wires is located on an opposite side of the SMT component 124. When the pad 119 is connected to ground, the separated bond wire 353a, as well as the external shield 340, may be grounded via the pad 119. Alternatively, when the pad 119 is not connected to ground, the separated bond wire 353a, as well as the external shield 340, may be grounded via the ground terminal 106. Notably, in various configurations, all of the truncated bond wires 351, 352 and 353, as well as the external shield 340 may be grounded via the same ground connection, i.e., one of the pads 117, 118, 119, and/or the ground terminal 106. The grounded separated bond wire 353s thus forms an internal shield 355C between the flipped chip IC 122 and the SMT component 124. The internal shield 355C blocks the internal electromagnetic radiation generated by the flipped chip IC 122 and the SMT component 124, resulting in reduced electromagnetic interference in the other component.

It is assumed, for purposes of illustration, that the electronic circuitry 122b of the flipped chip IC 122 generates a significant amount electromagnetic radiation, e.g., as compared to the acoustic filter 121, for example, thereby potentially subjecting the acoustic filter 121 to electromagnetic interference (e.g., cross-talk). This electromagnetic interference is typically enhanced by the fact that both the flipped chip IC 122 and the acoustic filter 121 are enclosed within the external shield 340, which causes internal reflection and further electromagnetic interference from the internal electromagnetic radiation. Accordingly, the internal shield 355B, comprising the pair of separated bond wires 352a and 352b, is provided within the circuit package 305 between the flipped chip IC 122 and the acoustic filter 121.

As mentioned above, the grounded external shield 340 is formed of a conductive material (e.g., metal), such as copper (Cu), silver (Ag), gold (Au), or aluminum (Al), for example. The external shield 340 may be a conformal metal coat, for example, applied to the surfaces of the circuit package 305 through a sputtering operation in thicknesses as discussed above with regard to the external shield 140, for example, although other thicknesses and combinations of thicknesses may be incorporated without departing from the scope of the present teachings. Generally, the external shield 340 protects the electronic components 120 from external electromagnetic radiation and environmental stress. The internal shields 355A, 355B and 355C protect the electronic components 120 from internal electromagnetic radiation, reducing internal electromagnetic interference and improving overall performance of the module 300A.

FIG. 3B is a simplified cross-sectional view of a module including flattened bond wires as internal shields, respectively, according to a representative embodiment. Referring to FIG. 3B, module 300B includes flattened bond wires 361, 362 and 363 as internal electromagnetic shielding. In particular, the module 300B includes a circuit package 305, which includes substrate 110, multiple electronic components 120 assembled or formed on the substrate 110, and molded compound 130 disposed over the substrate 110 and the electronic components 120. The module 300B further includes external shield 340 disposed on at least one outer surface of the circuit package 305, and electrically connected to ground, such that the module 300B is a shielded module. The external shield 340 is configured to protect the circuit package 305 (and the electronic components 120 within the circuit package 305) from external electromagnetic radiation, environmental stress, and the like.

In addition, the flattened bond wires 361, 362 and 363 are disposed between adjacent electronic components 120, respectively (prior to application of the molded compound 130). Each of the flattened bond wires 361, 362 and 363 is formed of a conductive material, such as metal, compatible with semiconductor processes, such as gold (Au), silver (Ag), copper (Cu), palladium coated copper (PCC) or aluminum (Al), for example. The flattened bond wires 361, 362 and 363 may be formed of the same materials as one another, and/or as the external shield 340. Or, one or more of the flattened bond wires 361, 362 and 363, and the external shield 340 may be formed of different materials, without departing from the scope of the present teachings.

In the depicted embodiment, the flattened bond wires 361, 362 and 363 are similar to the truncated bond wires 351, 352 and 353, except that during fabrication, the corresponding loops are not trimmed away or otherwise separated after formation and trimming of the molded compound 130. Rather, the apex or top portion of each of the flattened bond wires 361, 362 and 363 is flattened to a substantially horizontal position by application of the mold tool (not shown) into which the molded compound 130 is injected. That is, the flattened bond wires may be formed by clamping a mold tool to the substrate 110 to define a height above the substrate 110 of the molded compound 130, where the mold tool flattens a top portion of each of the bond wires 361, 362 and 363 extending beyond the desired height to a substantially horizontal position. In an embodiment, the molded compound 130 may be subsequently trimmed, e.g., by planarizing or etching, to remove a top portion of the molded compound 130, so the top surface of the molded compound is a desired height above the substrate 110. As a result of the trimming, a top portion (or none) of one or more of the bond wires 361, 362 and 363 flattened to the substantially horizontal position extending beyond the desired height is also trimmed while the top portion of the molded compound 130 is removed. This leaves a bond wire loop in place to act as internal shields 365A, 365B and 365C, respectively. Otherwise, the configuration is substantially the same as discussed above with reference to the module 300A.

FIGS. 4A to 4E are simplified cross-sectional views showing an illustrative method of fabricating modules with bond wires to be used as internal shields, according to a representative embodiment.

Figure 4A:
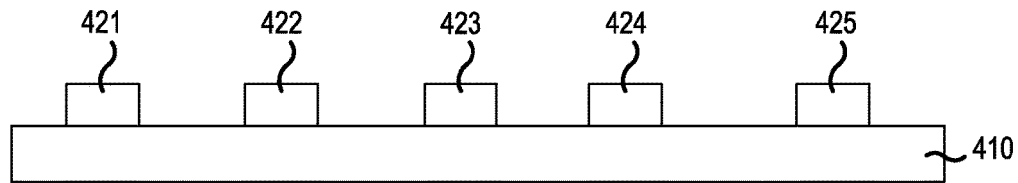
FIGS. 4A to 4E are simplified cross-sectional views showing an illustrative method of fabricating modules with bond wires to be used as internal shields, according to a representative embodiment.

Referring to FIG. 4A, multiple electronic components 421 to 425 are assembled or formed on a substrate 410. The electronic components 421 to 425 may be any of a variety of types, such as acoustic filers, flipped chip ICs, and/or SMT components, for example, as discussed above. The substrate 410 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example.

Figure 4B:
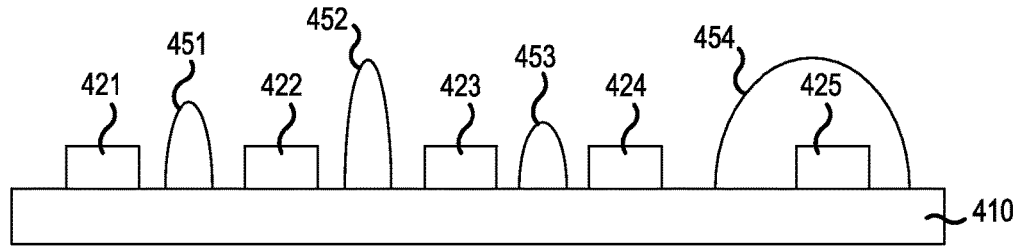

In FIG. 4B, bond wires formed as loops are attached to the substrate 410 (or attached to pads on or partially in the substrate 410, as discussed above). More particularly, bond wire 451 is attached between electronic components 421 and 422, bond wire 452 is attached between electronic components 422 and 423, and bond wire 453 is attached between electronic components 423 and 424. An additional bond wire 454 is attached to the substrate 410, but unlike the other bond wires 451 to 453, the bond wire 454 forms a loop over a single electronic component (i.e., electronic component 425), as opposed to between adjacent electronic components (e.g., electronic components 421 and 422). Thus, a singe bond wire, as opposed to a pair of bond wires, will be arranged between the electronic components 424 and 425, as further discussed below.

Figure 4C:
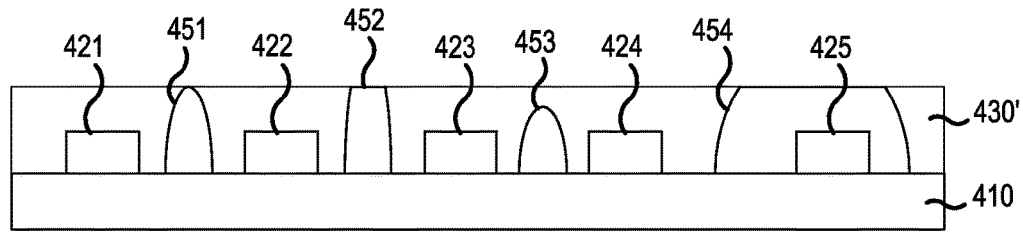

Referring to FIG. 4C, an initial molded compound 430' is injected into a mold tool (not shown) clamped to the substrate 410, the initial molded compound 430' filling the spaces among the electronic components 421 to 425, the bond wires 451 to 454, and the top surface of the substrate 410, encapsulating the same. Notably, the mold tool flattens the taller bond wires, such as bond wires 451, 452 and 454, that extend above the top surface of the initial molded compound 430' (as determined by the mold tool). The molded compound 130' may be formed of an epoxy resin, which is applied in a liquid or viscous state, and then allowed to set to provide the solid initial molded compound 430'.

Figure 4D:
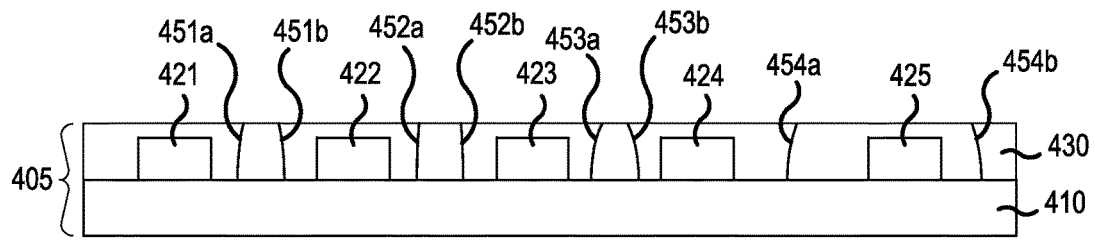

Referring to FIG. 4D, after removal of the mold tool, a top portion of the initial molded compound 430' is removed or trimmed to the desired height above the substrate 410, for example, by grinding, to provide molded compound 430. During the process of removing the top portion of the initial molded compound 430', the bond wires 451 to 454 are truncated, meaning that an apex of the loop formed by each of the bond wires 451 to 454 is removed, leaving corresponding sets of single bond wires. (In the case of flattened bond wires, discussed above with reference to FIG. 3B, the grinding step in FIG. 4D would not be performed or would end short of fully separating the loops of the bond wires 451, 452 and/or 454). Accordingly, truncated bond wire 451 provides a pair of separated bond wires 451a and 451b arranged between the electronic components 421 and 422, truncated bond wire 452 provides a pair of separated bond wires 452a and 452b arranged between the electronic components 422 and 423, and truncated bond wire 453 provides a pair of separated bond wires 453a and 453b arranged between the electronic components 423 and 424. Because the loop of the bond wire 454 passed over the electronic component 425, truncation of the bond wire 454 results in a single bond wire 454a (as opposed to a pair of bond wires) arranged between the electronic components 424 and 425, and another single bond wire 454b arranged on the opposite side of the electronic component 425. The result is formation of circuit package 405, which includes the substrate 410, the electronic components 421 to 425, the bond wires 451a, 451b, 452a, 452b, 453a, 453b, 45a and 454b, and the molded compound 430. Although not shown in FIGS. 4A to 4E, after applying (and trimming) the molded compound 430, the molded substrate 410 (or wafer) may be singulated into multiple circuit packages if the molded substrate 410 initially includes multiple circuit packages, as discussed above with reference to FIG. 2D.

Figure 4E:
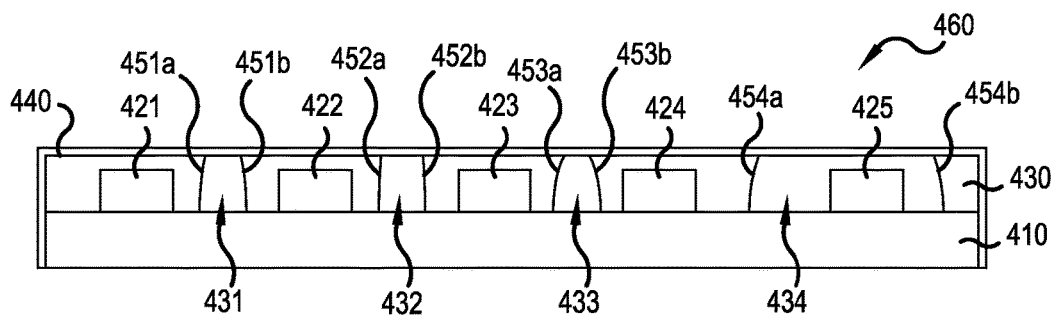

As shown in FIG. 4E, a conductive material, such as a conformal coating of metal, for example, is applied to the outer surfaces the circuit package 405 to provide an external shield 440, thereby creating a corresponding module (e.g., module 460). Referring to FIG. 4E, the external shield 440 is configured to protect the circuit package 405 from external electromagnetic radiation, as well as various environmental stresses, such as temperature and moisture. As discussed above, the external shield 440 is formed of an electrically conductive material, such as such as copper (Cu), silver (Ag), gold (Au), or aluminum (Al), for example, applied to the surface(s) of the circuit package 405, e.g., by a sputtering operation. Meanwhile, the pair of bond wires 451a and 451b provides an internal shield 431 between electronic components 421 and 422, the pair of bond wires 452a and 452b provides an internal shield 432 between electronic components 422 and 423, the pair of bond wires 453a and 453b provides an internal shield 433 between electronic components 423 and 424, and the bond wire 454a provides an internal shield 434 between electronic components 424 and 425. Each of the internal shields 431 to 434 protects the corresponding adjacent electronic components 421 to 425 against internal electromagnetic radiation (e.g., generated by one another). Each of the external shield 440 and the internal shields 431 to 434 are electrically grounded, and may be grounded along with the external shield 240 via a ground terminal (not shown) exposed on an outer surface of the substrate 410 in the circuit package 405, similar to the ground terminal 106 discussed above with respect to FIG. 1B.

Still other types of internal shields may be provided without forming one or more trenches in a molded compound and/or without forming shielding bond wires. For example, FIG. 5A is a simplified cross-sectional view of a module including a circuit package, in which shielding from electromagnetic interference between electronic components is accomplished by selectively partitioning the external shield using gaps, thereby enhancing isolation, according to a representative embodiment.

Figure 5A:
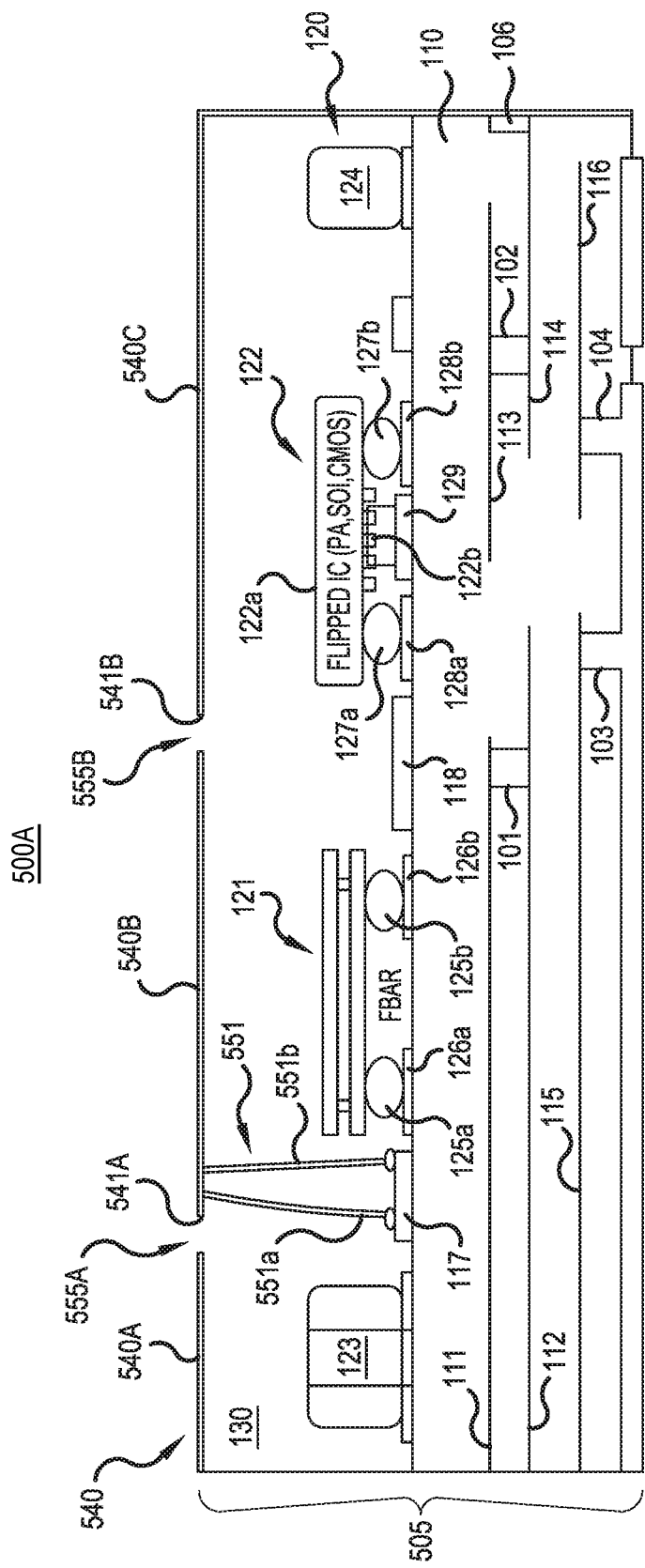
FIGS. 5A and 5B are simplified cross-sectional views of modules including a partitioned external shield separated by gaps acting as internal shields, respectively, according to a representative embodiment.

Referring to FIG. 5A, module 500A includes external shield 540 is cut into shield partitions 540A, 540B and 540C, separated by gaps 541A and 541B, for example, to form internal shields 555A and 555B, respectively. More particularly, the module 500A includes a circuit package 505, which includes substrate 110, multiple electronic components 120 assembled or formed on the substrate 110, and molded compound 130 disposed over the substrate 110 and the electronic components 120. The external shield 540 is disposed on at least one outer surface of the circuit package 505, making the module 500A an externally shielded module, where the shield partitions 540A, 540B and 540C may be separately grounded, for better isolation between electronic components, as discussed below. The external shield 540 is configured to protect the circuit package 505 (and the electronic components 120 within the circuit package 505) from external electromagnetic radiation, environmental stress, and the like.

As discussed above, the substrate 110 may be formed of any material compatible with semiconductor processes, and includes embedded circuitry, indicated by representative traces 111, 112, 113, 114, 115 and 116, interconnected by representative vias 101, 102, 103 and 104. In the depicted embodiment, ground terminal 106 is exposed on the side outer surface of the substrate 110 and ground plane 107 is provided on a bottom surface of the substrate 110. Of course, alternative arrangements of traces, vias, terminals, ground planes and other electrical circuitry may be included in or on the substrate 110, to provide unique benefits for any particular situation or to meet application specific design requirements of various implementations, without departing from the scope of the present teachings.

In the depicted embodiment, representative electronic components 120 assembled or formed on the substrate 110 include, for purposes of illustration, an acoustic filter 121, a flipped chip IC 122, and SMT components 123 and 124, as discussed above. Examples of the acoustic filter 121 include SAW resonator devices containing SAW resonators, and BAW resonator devices containing FBARs and/or SMRs. Examples of the flipped chip IC 122 include power amplifiers, CMOS circuits and integrated SOI circuits. Of course, the number and types of electronic components 120 are not limited, and thus may vary without departing from the scope of the present teachings.

The molded compound 130 is disposed over the substrate 110 and the electronic components 120, as well as a truncated bond wire 551 (indicated by a pair of bond wires 551*a* and 551*b*). As discussed above with regard to truncated bond wires 351 and 352, the bond wire 551 initially had both ends connected to the pad 117 forming a loop, where the pad 117 may be electrically grounded. The molded compound 130 is then applied at a thickness less than a height of an apex of the loop, and thus the portion of the bond wire 551 extending beyond the top surface of the molded compound 130 may be trimmed away prior to application of the external shield 540, resulting in the pair of separated bond wires 551*a* and 551*b*. Similarly, the molded compound 130 may be applied at a thickness greater than or equal to the height of the apex of the loop, and then the molded compound 130 may be etched and/or planarized down to a thickness less than the height of the apex prior to application of the external shield 540, again resulting in the pair of separated bond wires 551*a* and 551*b*. The molded compound 130 generally protects the electronic components 120 and provides additional structural support to the module 500. In various embodiments, the molded compound 130 may hermetically seal the electronic components 120 within the circuit package 505. The external shield 540 is then applied to the circuit package 505, as discussed above with reference to the external shield 540, for example.

Figure 5B:
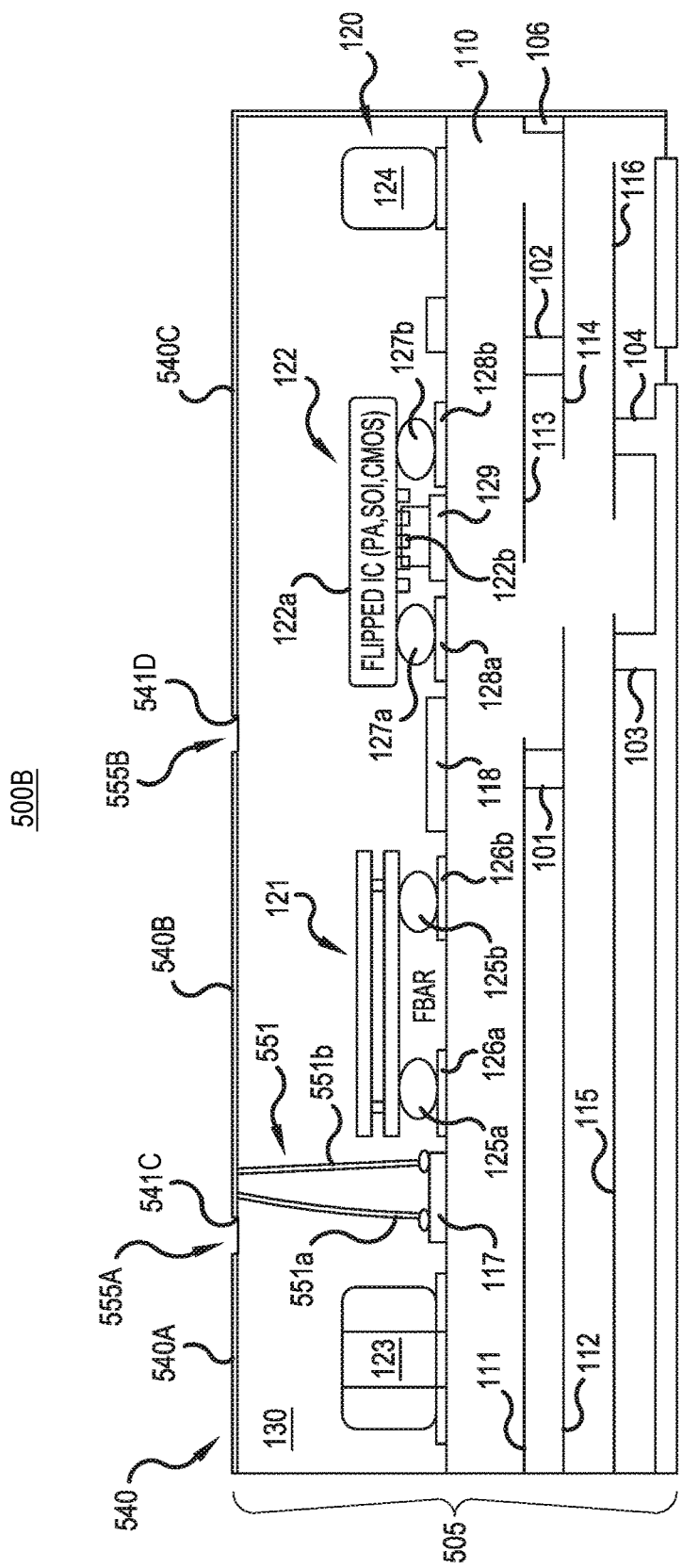

In the depicted embodiment, the gaps 541A and 541B are formed in the external shield 540 between adjacent electronic components 120, respectively. That is, the gap 541A is disposed between the SMT component 123 and the acoustic filter 121, and the gap 541B is disposed between the acoustic filter 121 and the flipped chip IC 122. An amount of shielding of the SMT component 123 and the acoustic filter 121 is a function of a frequency of the electromagnetic radiation and a size of the corresponding gap 541A, and likewise an amount of shielding of the acoustic filter 121 and the flipped chip IC 122 is a function of a frequency of the electromagnetic radiation and a size of the corresponding gap 541B. The gaps 541A and 541B may formed by any technique compatible with semiconductor fabrication processes, such as plasma etching, laser cutting, mechanical sawing, or wet etching the like. The representative shield partitions 540A, 540B and 540C defined by the gaps 541A and 541B may be any shape or size. Also, the gaps may be formed entirely through the thickness of the external shield 140, as shown by the gaps 541A and 541B in FIG. 5A, or only partially through the thickness of the external shield 540 (e.g., partially through the top side of the external shield 540), as shown by the gaps 541C and 541D of module 500B in FIG. 5B, without departing from the scope of the present teachings.

In various embodiments, the shield partitions 540A, 540B and 540C may be separately grounded. For example, in the depicted configuration, shield partition 540A is grounded through the truncated bond wire 551, indicated by the pair of bond wires 551*a* and 551*b* connected to the pad 117, which is connected to ground. The pair of bond wires 551*a* and 552 may be formed by the process described above with reference to FIG. 3 and FIGS. 4A to 4E, for example. Each of the bond wires 551*a* and 552 is formed of a conductive material, such as metal, compatible with semiconductor processes, such as gold (Au), silver (Ag), copper (Cu), palladium coated copper (PCC) or aluminum (Al), for example, and may be formed of the same or different materials as the external shield 540. The shield partition 540B may be grounded at the ground terminal 106 exposed on the side outer surface of the substrate 110 in the circuit package 505, for example. Of course, the separate grounding may be accomplished through other means, such as via trenches created by mold tool protrusions or laser ablation, as discussed above with reference to FIGS. 1A and 1D, for example, without departing from the scope of the present teachings.

The gap 541A (together with the truncated bond wire 551, in the depicted configuration) creates an internal shield 555A between the SMT component 123 and the acoustic filter 121, and the gap 541B creates an internal shield 555B between the acoustic filter 121 and the flipped chip IC 122 by electrically and physically separating the grounded external shield over those components, thereby at least partially reducing coupling or cross-talk. The internal shields 555A and 555B therefore reduce and/or at least partially block the internal electromagnetic interference among the adjacent electronic components 120.

As mentioned above, the grounded external shield 540 (and thus each of the shield partitions 540A, 540B and 540C) is formed of a conductive material (e.g., metal), such as copper (Cu), silver (Ag), gold (Au), or aluminum (Al), for example. The external shield 540 may be a conformal metal coat, for example, applied to the surfaces of the circuit package 505 through a sputtering operation. In various configurations, the external shield 540 may also include a SUS finish to improve aesthetics and enhance resistance to oxidation and other contamination. The external shield 540 may be applies to have thicknesses as discussed above with regard to the external shield 140, for example, although other thicknesses and combinations of thicknesses may be incorporated without departing from the scope of the present teachings. Generally, the external shield 540 protects the electronic components 120 from external electromagnetic radiation and environmental stress. The internal shields 555A and 555B protect the electronic components 120 from internal electromagnetic radiation, reducing internal electromagnetic interference and improving overall performance of the module 500.

FIGS. 6A to 6F are simplified cross-sectional views showing an illustrative method of fabricating modules with a partitioned external shield to be used as internal shields, according to a representative embodiment. Notably, FIGS. 6A to 6E are formed in substantially the same manner described above with reference to FIGS. 4A to 4E, and thus the descriptions of FIGS. 6A to 6E are abbreviated herein, for the sake of convenience.

Figure 6A:
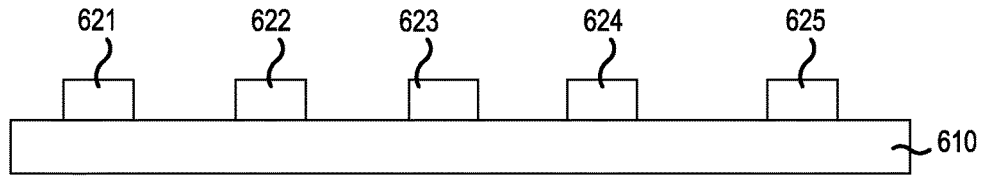
FIGS. 6A to 6F are simplified cross-sectional views showing an illustrative method of fabricating modules with a partitioned external shield to be used as internal shields, according to a representative embodiment.
Figure 6B:
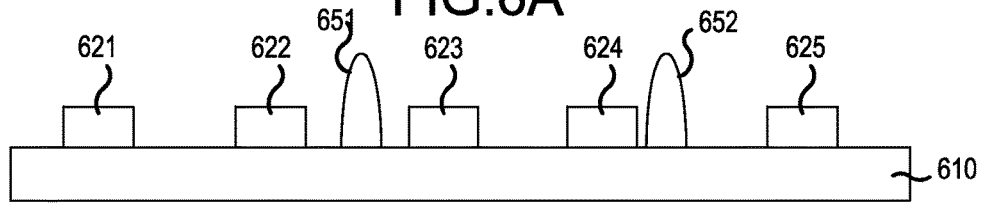

Referring to FIG. 6A, multiple electronic components 621 to 625 are assembled or formed on a substrate 610. In FIG. 6B, bond wires 651 and 652 are formed as loops attached to the substrate 610 (or attached to pads on or partially in the substrate 610, as discussed above). More particularly, bond wire 651 is attached between electronic components 622 and 623, and bond wire 652 is attached between electronic components 624 and 425.

Figure 6C:
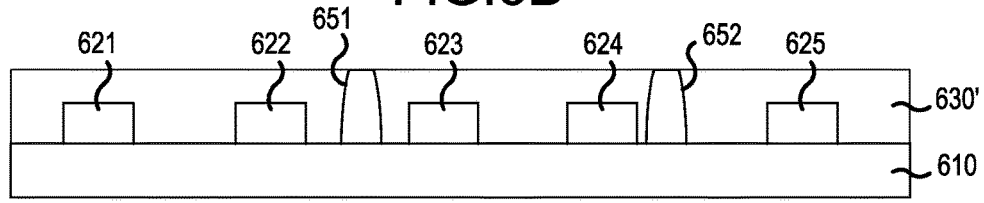
Figure 6D:
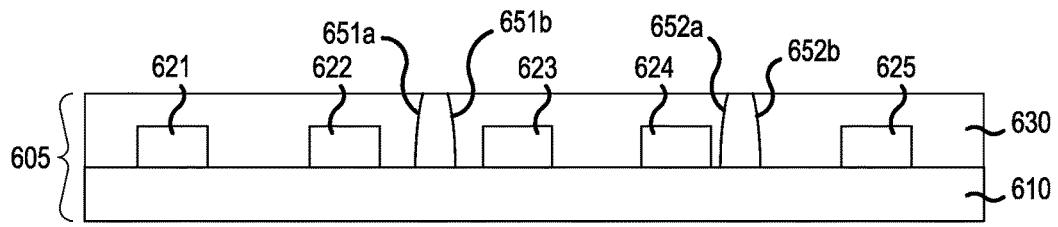

Referring to FIG. 6C, an initial molded compound 630' is injected into a mold tool (not shown) clamped to the substrate 610, the initial molded compound 630' filling the spaces among the electronic components 621 to 625, the bond wires 651 to 652, and the top surface of the substrate 610, encapsulating the same. The mold tool will flatten the bond wires 651 and 652 that extend above the top surface of the initial molded compound 630' (as determined by the mold tool). The molded compound may be formed of an epoxy resin, which is applied in a liquid or viscous state, and then allowed to set to provide the solid initial molded compound 630'. Referring to FIG. 6D, after removal of the mold tool, a top portion of the initial molded compound 630' is removed or trimmed to the desired height above the substrate 610 to provide molded compound 630. During the process of removing the top portion of the initial molded compound 630', the bond wires 651 and 652 are truncated, meaning that an apex of the loop formed by each of the bond wires 651 and 652 is removed, leaving corresponding sets of single bond wires. Accordingly, truncated bond wire 651 provides a pair of separated bond wires 651a and 651b arranged between the electronic components 622 and 623, and truncated bond wire 652 provides a pair of separated bond wire 652a and 652b arranged between the electronic components 624 and 625. The result is formation of circuit package 605, which includes the substrate 610, the electronic components 621 to 625, the bond wires 651a, 651b, 652a and 652b, and the molded compound 630. Although not shown in FIGS. 6A to 6F, after applying (and trimming) the molded compound 630, the molded substrate 610 (or wafer) may be singulated into multiple circuit packages if the molded substrate 610 initially includes multiple circuit packages, as discussed above with reference to FIG. 2D.

Figure 6E:
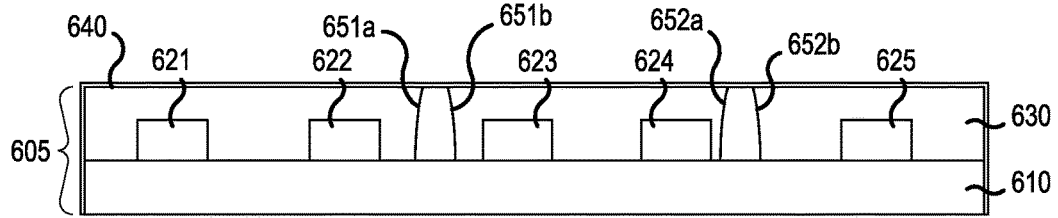

As shown in FIG. 6E, a conductive material, such as a conformal coating of metal, for example, is applied to the outer surfaces the circuit package 605 to provide an external shield 640. The external shield 640 is configured to protect the circuit package 605 from external electromagnetic radiation, as well as various environmental stresses, such as temperature and moisture. As discussed above, the external shield 640 is formed of an electrically conductive material, such as such as copper (Cu), silver (Ag), gold (Au), or aluminum (Al), for example, applied to the surface(s) of the circuit package 605, e.g., by a sputtering operation.

Figure 6F:
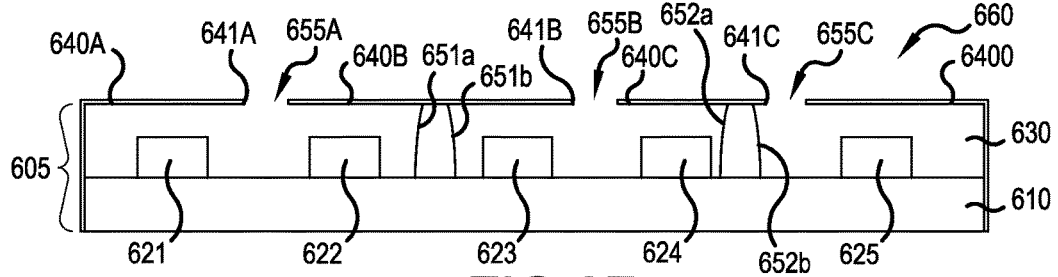

Referring to FIG. 6F, gaps 641A, 641B and 641C are formed in the external shield 640. As discussed above, the gaps 641A, 641B and 641C may be formed using any technique compatible with semiconductor fabrication processes, such as plasma etching, laser cutting or mechanical sawing, for example. In the depicted embodiment, the gap 641A is formed between the electronic components 621 and 622, creating internal shield 655A; the gap 641B is formed between the electronic components 623 and 624, creating internal shield 655B; and the gap 641C is formed between the electronic components 624 and 625, creating internal shield 655C. The gaps 641A, 641B and 641C separate the external shield 640 to form the shield partitions 640A, 640B, 640C and 640D, respectively, thereby creating a corresponding module (e.g., module 660).

Meanwhile, the pair of bond wires 651a and 651b electrically grounds the shield partition 640B (while also providing an internal shield between the electronic components 622 and 623). Also, the pair of bond wires 652a and 652b electrically grounds the shield partition 640C (while also providing additional shield for the internal shield 655C). The shield partitions 640A and 640D may be grounded to ground terminals (not shown) in the substrate 610, for example, similar to the ground terminal 106 discussed above with respect to FIG. 1B. Each of the internal shields 655A to 655C (as well as the internal shield comprising bond wires 651a and 651b) protects the corresponding adjacent electronic components 621 to 625 against internal electromagnetic radiation (e.g., generated by one another).

Figure 7:
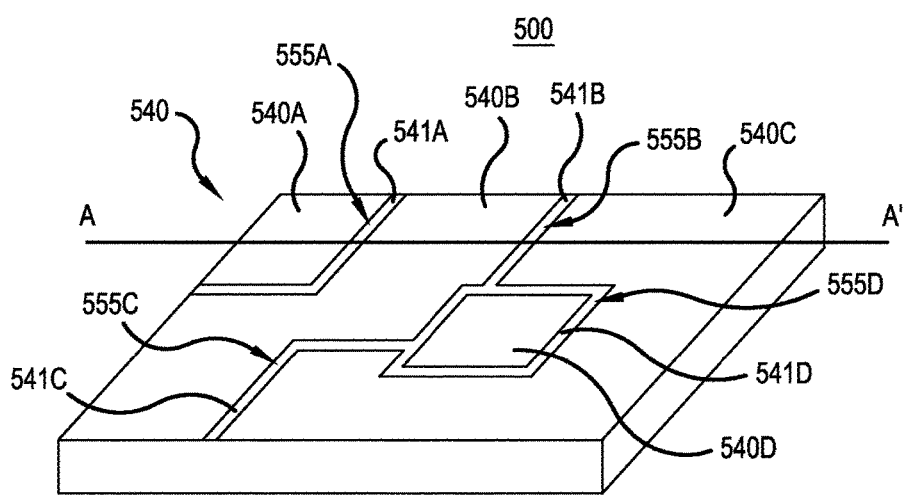
FIG. 7 is a top perspective view of a module including a partitioned external shield separated by gaps acting as internal shields, respectively, according to a representative embodiment.

FIG. 7 is a top perspective view of a module including a partitioned external shield separated by gaps acting as internal shields, respectively, according to a representative embodiment.

Referring to FIG. 7, module 500 is shown with gaps 541A, 541B, 541C and 541D, which separate the external shield 540 into shield partitions 540A, 540B, 540C and 540D, respectively. As a result, internal shields 555A, 555B, 555B and 555C are formed corresponding to the gaps 541A, 541B, 541C and 541D, respectively. Notably, the cross-section of module 500 is taken along line A-A' of FIG. 7. Also, as shown in FIG. 7, the gaps (e.g., gaps 541A, 541B, 541C and 541D) may be formed in any of a variety of configurations in the external shield 540 to provide unique benefits for any particular situation or to meet application specific design requirements of various implementations, without departing from the scope of the present teachings. For example, the gap 541D is formed in a closed geometric shape (e.g., a substantially square shape in the depicted embodiment, although other closed geometric shapes may be incorporated), resulting in correspondingly shaped shield partition 540D and internal shield 555D. Such a closed geometric shaped internal shield 555D may be used, for example, to surround and protect an electronic component against internal electromagnetic radiation from all sides.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A module, comprising:
a circuit package, comprising:
a plurality of electronic components on a substrate; and
a molded compound disposed over the substrate and the plurality of electronic components; and
an external shield disposed on at least one outer surface of the circuit package, the external shield being segmented into a plurality of external shield partitions that are grounded, respectively, adjacent external shield partitions of the plurality of external shield partitions being separated by a corresponding gap located between adjacent electronic components of the plurality of electronic components,
wherein the external shield is configured to protect the circuit package from external electromagnetic radiation and environmental stress, and
wherein each corresponding gap separating the adjacent external shield partitions is configured to provide internal shielding of at least one of the electronic components, between which the corresponding gap is located, from internal electromagnetic radiation generated by the other of the adjacent electronic components.

2. The module of claim 1, wherein an amount of shielding of the at least one of the electronic components provided by the corresponding gap between the adjacent external shield partitions is a function of a frequency of the internal electromagnetic radiation and a size of the corresponding gap between the adjacent external shield partitions.

3. The module of claim 1, wherein at least one corresponding gap is formed entirely through a thickness of the external shield.

4. The module of claim 1, wherein at least one corresponding gap is formed partially through a full thickness of the external shield.

5. The module of claim 1, wherein at least one of the external shield partitions is grounded via at least one bond wire contacting the at least one of the external shield partitions and a pad on or in the substrate, or to a conductive or non-conductive material dispensed on the pad.

6. The module of claim 5, wherein the at least one bond wire is a truncated bond wire, excluding a top portion of a bond wire loop.

7. The module of claim 5, wherein the at least one bond wire is a flattened bond wire, having a flat top portion of a bond loop substantially horizontal with respect to a top surface of the molded compound.

8. The module of claim 5, wherein the at least one bond wire comprises at least one of gold (Au), silver (Ag), copper (Cu), palladium coated copper (PCC) and aluminum (Al).

9. The module of claim 1, wherein at least one of the external shield partitions is grounded via a ground terminal exposed at a side outer surface of the substrate and connected to a metal plane substrate.

10. The module of claim 1, wherein the plurality of external shield partitions are of at least one of copper (Cu), silver (Ag), gold (Au), or aluminum (Al).

11. The module of claim 1, wherein the external shield is formed of a conformal metal coat and a stainless steel (SUS) applied to the at least one outer surface of the circuit package.

12. The module of claim 1, wherein the external shield is further configured to simultaneously provide protection to other circuit packages from electromagnetic radiation emitted by the circuit package of the module.

13. The module of claim 1, wherein the corresponding gap is formed in a closed geometric shape, resulting in correspondingly shaped external shield partition.

14. The module of claim 13, wherein the geometric shaped gap provides internal shielding surrounding the at least one of the electronic components.

15. A module, comprising:
a substrate;
a plurality of electronic components on the substrate;
a molded compound disposed over the substrate and the plurality of electronic components; and
an external shield comprising a conformal metal coat disposed on at least one outer surface of the molded compound, the conformal metal coat being segmented into a plurality of partitions that are grounded, respectively, adjacent partitions of the plurality of partitions being separated by a corresponding gap located between adjacent electronic components of the plurality of electronic components,
wherein the external shield is configured to protect the plurality of electronic components from external electromagnetic radiation and environmental stress, and
wherein each corresponding gap separating the adjacent partitions is configured to provide internal shielding of at least one of the electronic components, between which the corresponding gap is located, from internal electromagnetic radiation generated by the other of the adjacent electronic components.

* * * * *